US008217465B2

(12) United States Patent
DeBruler

(10) Patent No.: US 8,217,465 B2
(45) Date of Patent: *Jul. 10, 2012

(54) SEMICONDUCTOR CONSTRUCTIONS

(75) Inventor: Lee DeBruler, Boise, ID (US)

(73) Assignee: Micron Technology, Inc., Boise, ID (US)

(*) Notice: Subject to any disclaimer, the term of this patent is extended or adjusted under 35 U.S.C. 154(b) by 34 days.

This patent is subject to a terminal disclaimer.

(21) Appl. No.: 12/852,100

(22) Filed: Aug. 6, 2010

(65) Prior Publication Data

US 2010/0295158 A1    Nov. 25, 2010

Related U.S. Application Data

(60) Continuation of application No. 12/399,266, filed on Mar. 6, 2009, now Pat. No. 7,791,143, which is a division of application No. 11/507,695, filed on Aug. 21, 2006, now Pat. No. 7,521,371.

(51) Int. Cl.
*H01L 29/76* (2006.01)
*H01L 29/94* (2006.01)
*H01L 31/062* (2012.01)

(52) U.S. Cl. ........ 257/368; 257/327; 257/346; 257/365; 257/E21.038

(58) Field of Classification Search .......... 257/327, 257/346, 368, 365, E21.038
See application file for complete search history.

(56) References Cited

U.S. PATENT DOCUMENTS

| 5,202,272 | A | 4/1993 | Hsieh et al. |
| 5,688,723 | A | 11/1997 | Okamoto et al. |
| 5,705,414 | A | 1/1998 | Lustig |
| 5,950,091 | A | 9/1999 | Fulford, Jr. et al. |
| 6,291,137 | B1 * | 9/2001 | Lyons et al. ........... 430/313 |
| 6,362,057 | B1 | 3/2002 | Taylor et al. |
| 6,423,475 | B1 | 7/2002 | Lyons et al. |
| 6,610,604 | B1 | 8/2003 | Ang et al. |
| 7,232,722 | B2 | 6/2007 | Van Houdt et al. |
| 7,791,143 | B2 * | 9/2010 | DeBruler ................ 257/368 |
| 2006/0234165 | A1 | 10/2006 | Kamigaki et al. |
| 2007/0238053 | A1 * | 10/2007 | Hashimoto ............. 430/313 |

* cited by examiner

*Primary Examiner* — Shouxiang Hu
(74) *Attorney, Agent, or Firm* — Wells St. John P.S.

(57) ABSTRACT

In some embodiments, an opening is formed through a first material, and sidewall topography of the opening is utilized to form a pair of separate anistropically etched spacers. The spacers are utilized to pattern lines in material underlying the spacers. Some embodiments include constructions having one or more openings which contain steep sidewalls joining to one another at shallow sidewall regions. The constructions may also contain lines along and directly against the steep sidewalls, and spaced from one another by gaps along the shallow sidewall regions.

9 Claims, 28 Drawing Sheets

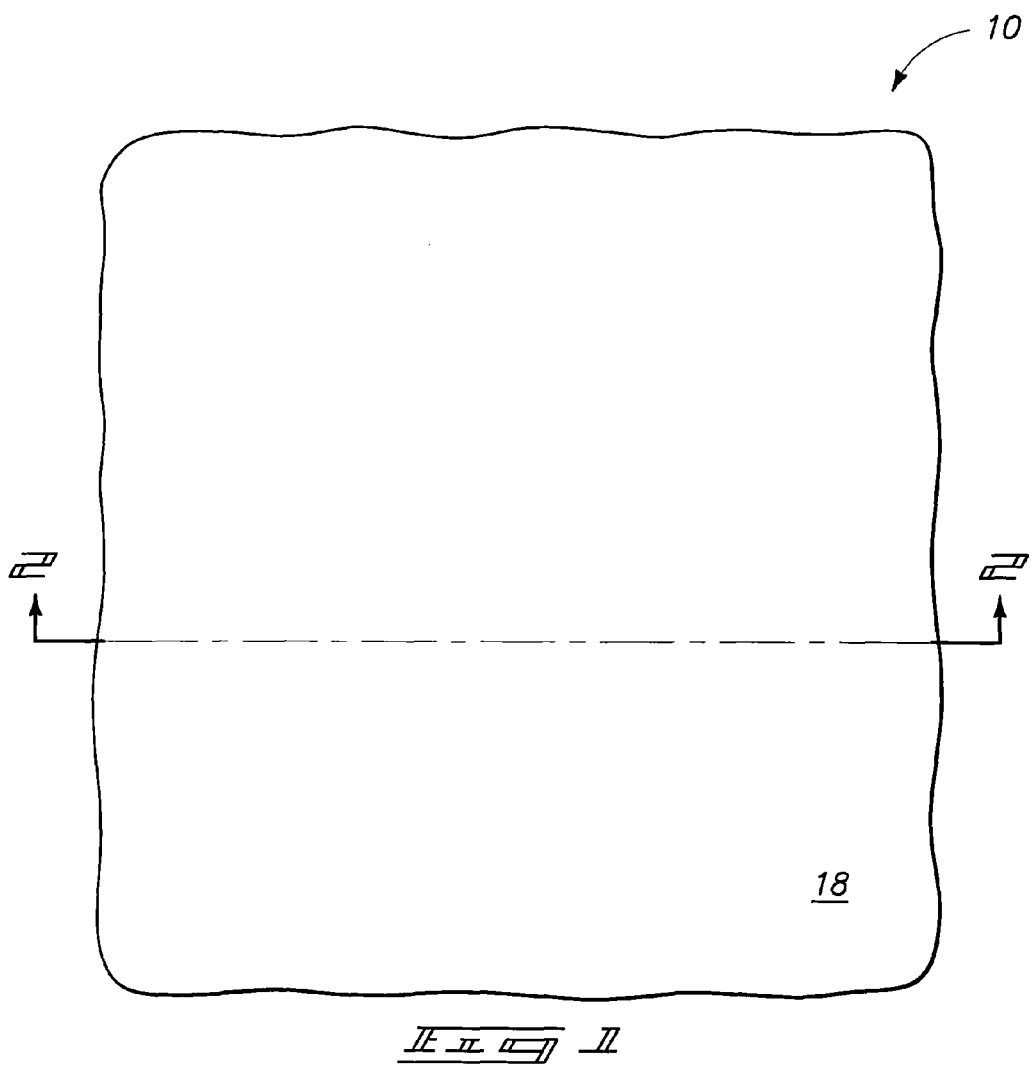
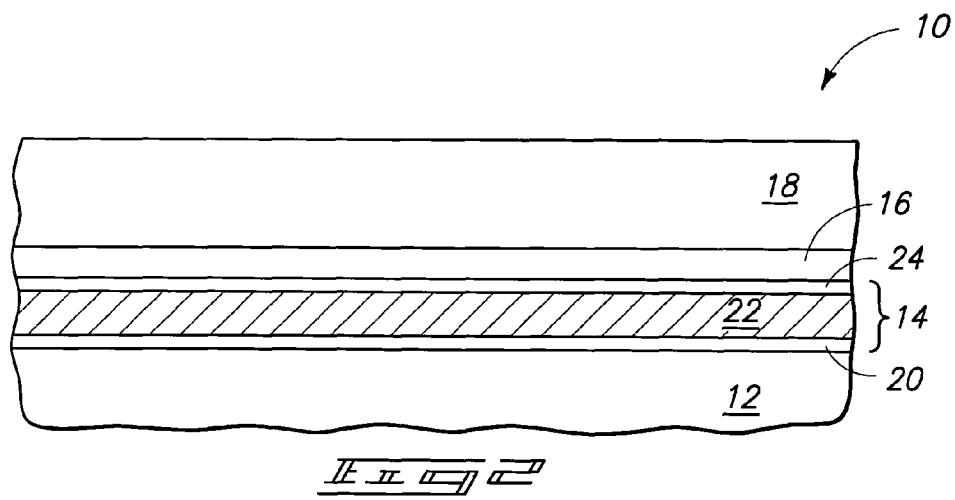

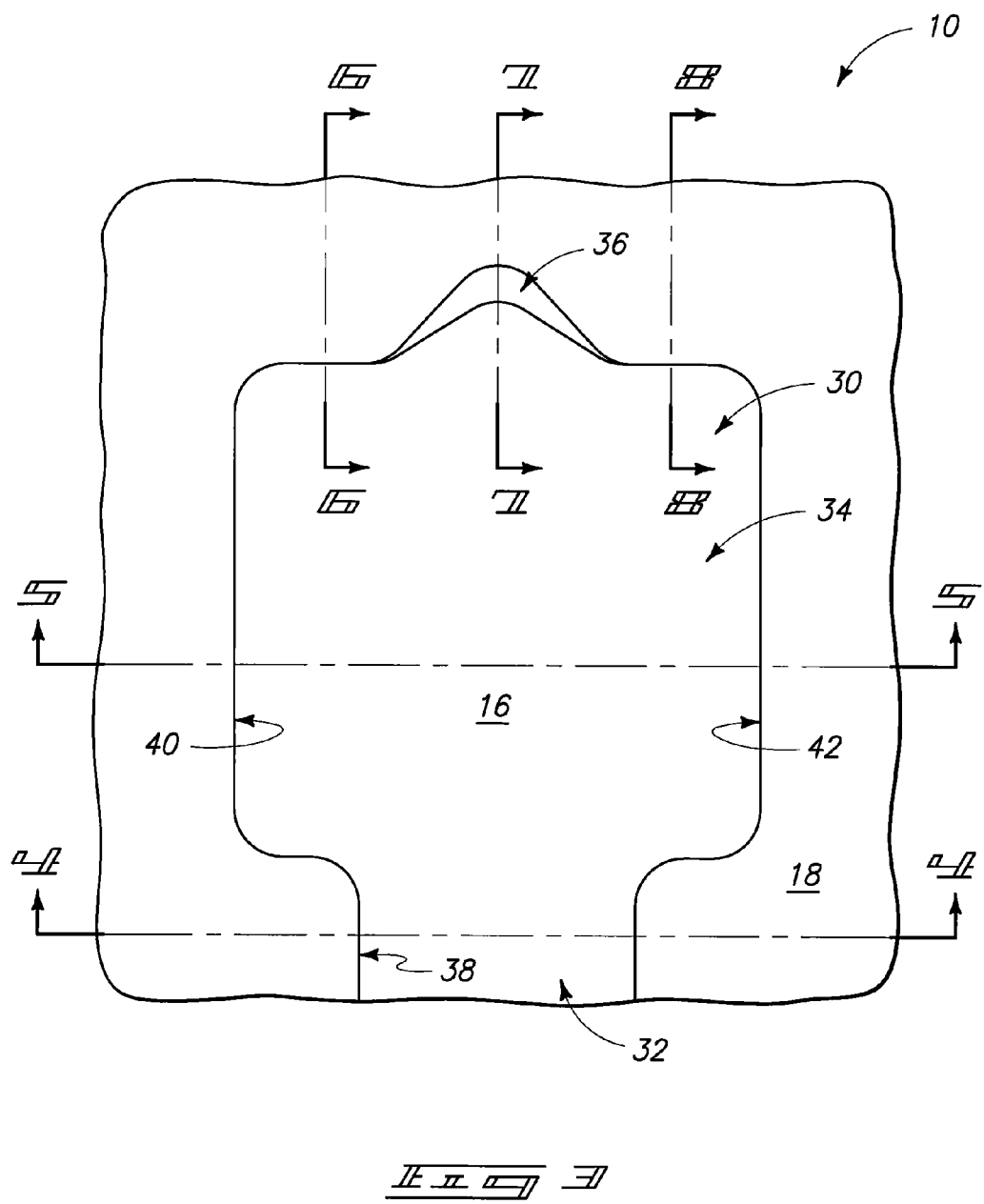

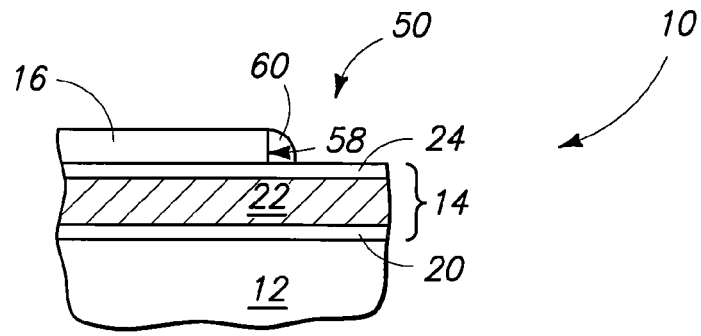
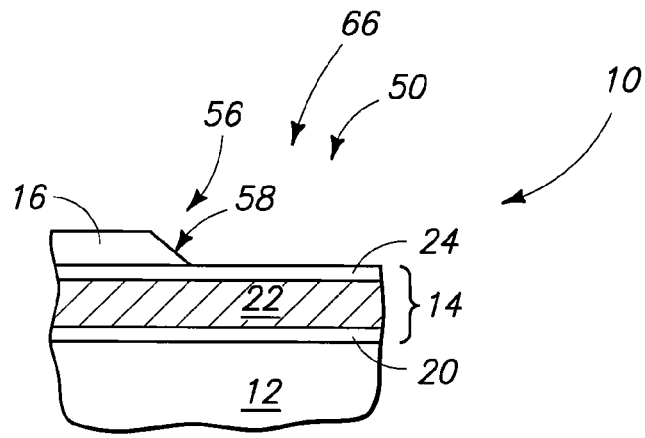
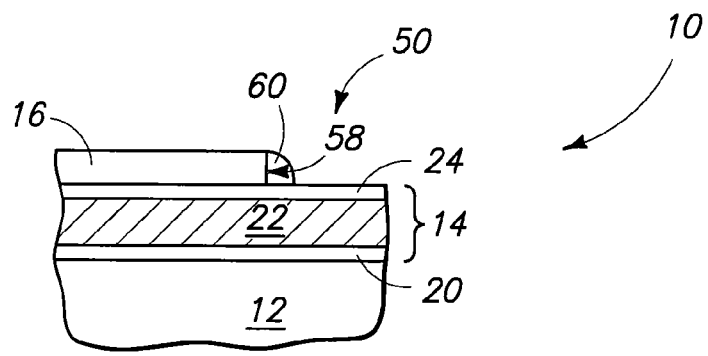

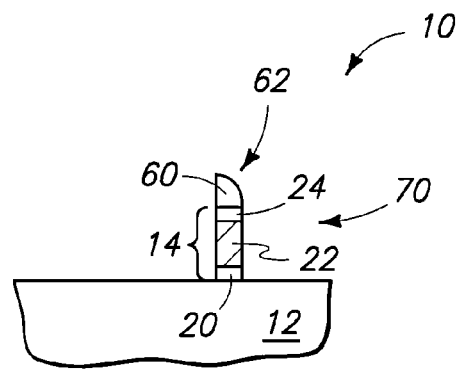
FIG. 38
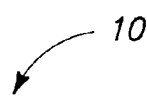
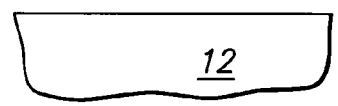
FIG. 39
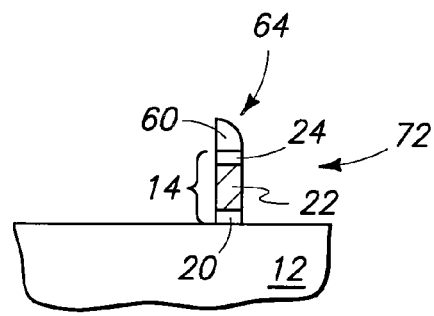
FIG. 40

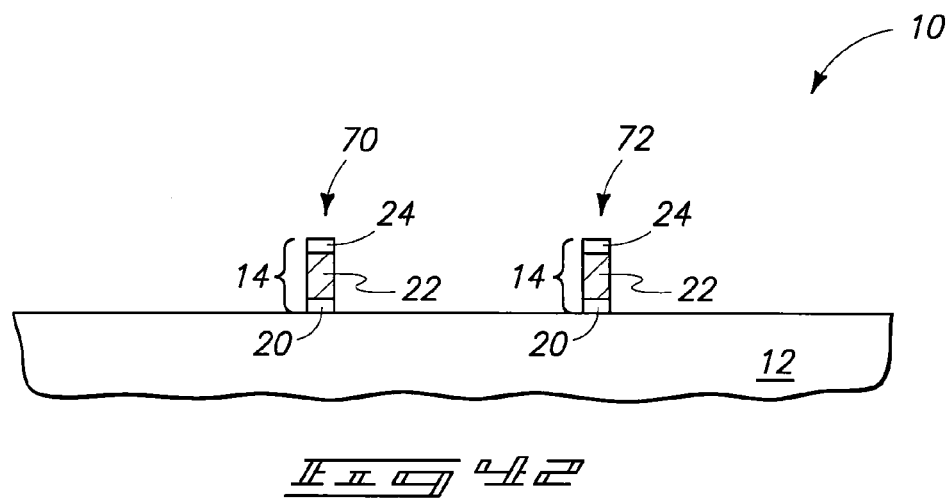
_FIG 42_
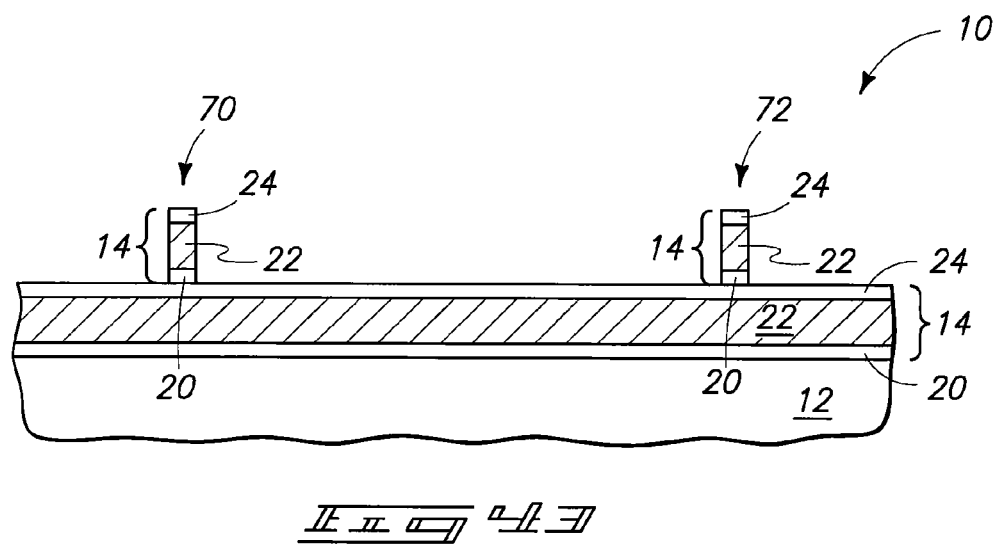
_FIG 43_

US 8,217,465 B2

SEMICONDUCTOR CONSTRUCTIONS

RELATED PATENT DATA

This patent resulted from a continuation of U.S. patent application Ser. No. 12/399,266, which was filed Mar. 6, 2009, and which is hereby incorporated herein by reference; which resulted from a divisional of U.S. patent application Ser. No. 11/507,695, which was filed Aug. 21, 2006, which is now U.S. Pat. No. 7,521,371 and which is hereby incorporated herein by reference.

TECHNICAL FIELD

The technical field is semiconductor constructions, and methods of forming lines associated with semiconductor constructions.

BACKGROUND

Numerous applications exist in which it is desired to form lines associated with semiconductor constructions, including, for example, applications in which it is desired to form wordlines. It is further desired to form semiconductor constructions quickly during a fabrication process, while maintaining uniformity and quality of the constructions. Accordingly, it is desired to develop methods for forming lines which may maintain or enhance quality of the lines, and which may also lead to improved throughput of a fabrication process.

BRIEF DESCRIPTION OF THE DRAWINGS

FIGS. 1 and 2 are a fragmentary top view and cross-sectional side view, respectively, of a semiconductor construction at a preliminary processing stage in accordance with an embodiment. The cross-section of FIG. 2 is along the line 2-2 of FIG. 1.

FIGS. 3-8 are a fragmentary top view (FIG. 3) and cross-sectional side views (FIGS. 4-8) of the semiconductor construction of FIGS. 1 and 2 shown at a processing stage subsequent to that of FIGS. 1 and 2. The cross-sections of FIGS. 4-8 are along the lines 4-4, 5-5, 6-6, 7-7, and 8-8, respectively, of FIG. 3.

FIGS. 23-28 are a fragmentary top view (FIG. 23) and cross-sectional side views (FIGS. 24-28) of the semiconductor construction of FIGS. 1 and 2 shown at a processing stage subsequent to that of FIGS. 17-22. The cross-sections of FIGS. 24-28 are along the lines 24-24, 25-25, 26-26, 27-27, and 28-28, respectively, of FIG. 23.

FIGS. 35-40 are a fragmentary top view (FIG. 35) and cross-sectional side views (FIGS. 36-40) of the semiconductor construction of FIGS. 1 and 2 shown at a processing stage subsequent to that of FIGS. 29-34. The cross-sections of FIGS. 36-40 are along the lines 36-36, 37-37, 38-38, 39-39, and 40-40, respectively, of FIG. 35.

FIGS. 41-46 are a fragmentary top view (FIG. 41) and cross-sectional side views (FIGS. 42-46) of the semiconductor construction of FIGS. 1 and 2 shown at a processing stage subsequent to that of FIGS. 35-40. The cross-sections of FIGS. 42-46 are along the lines 42-42, 43-43, 44-44, 45-45, and 46-46, respectively, of FIG. 41.

DETAILED DESCRIPTION OF THE ILLUSTRATED EMBODIMENTS

Figure 4:
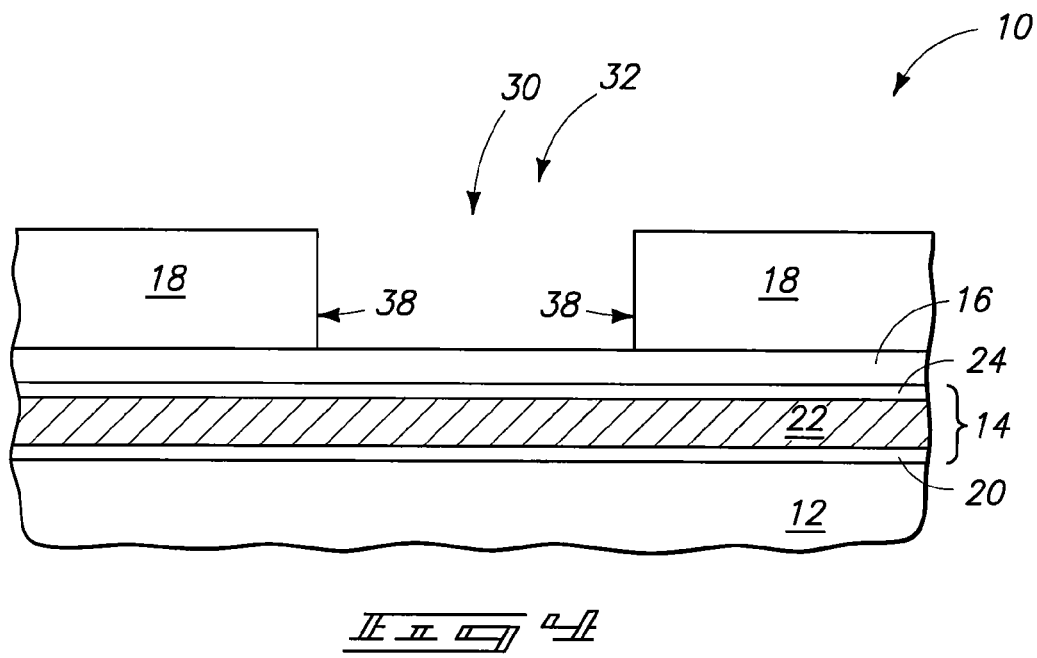
Figure 5:
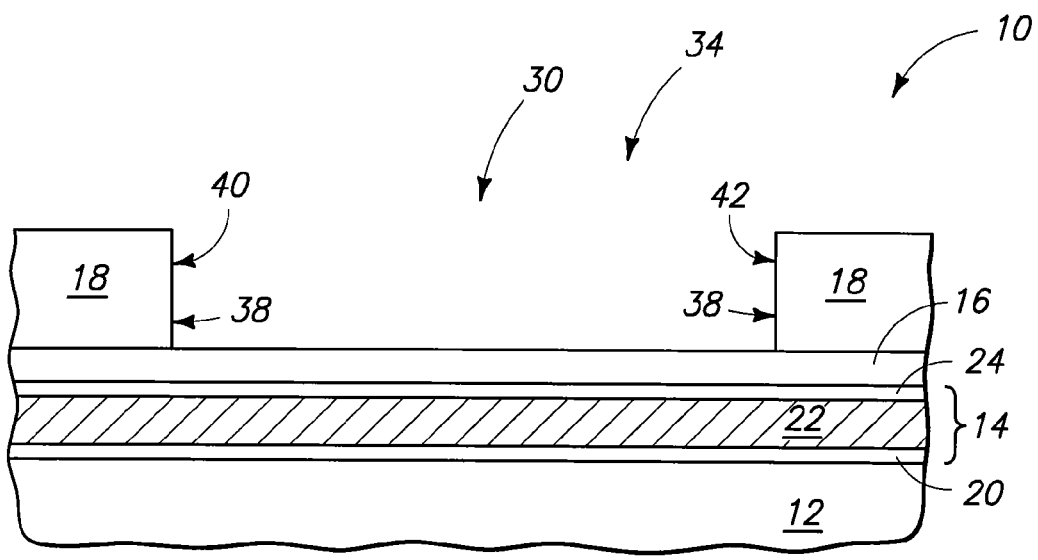
Figure 6:
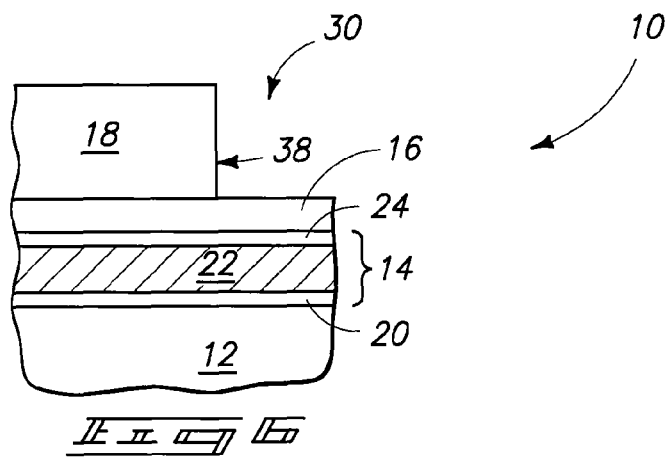
Figure 7:
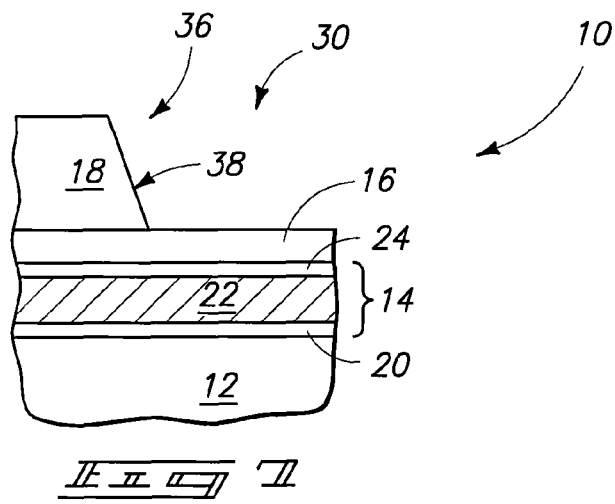
Figure 8:
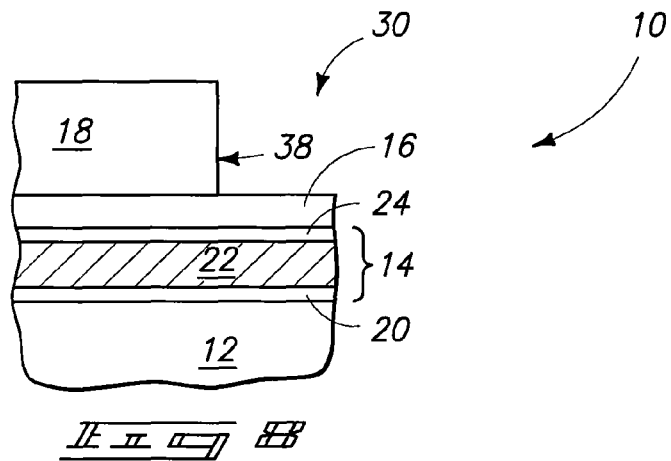
Figure 9:
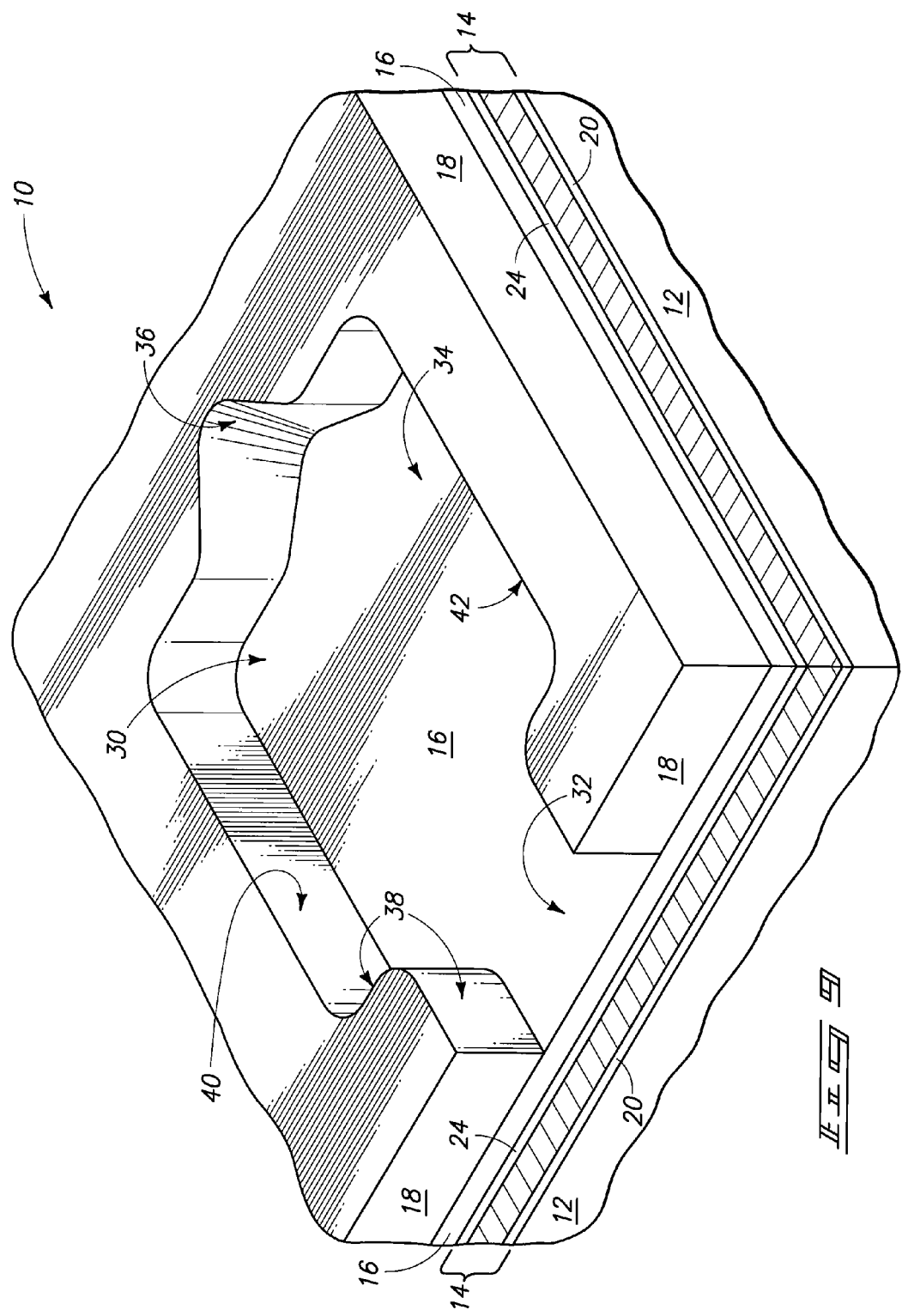
FIG. 9 is a fragmentary, diagrammatic, three-dimensional view of the semiconductor construction of FIGS. 3-8 at the processing stage of FIGS. 3-8.
Figure 10:
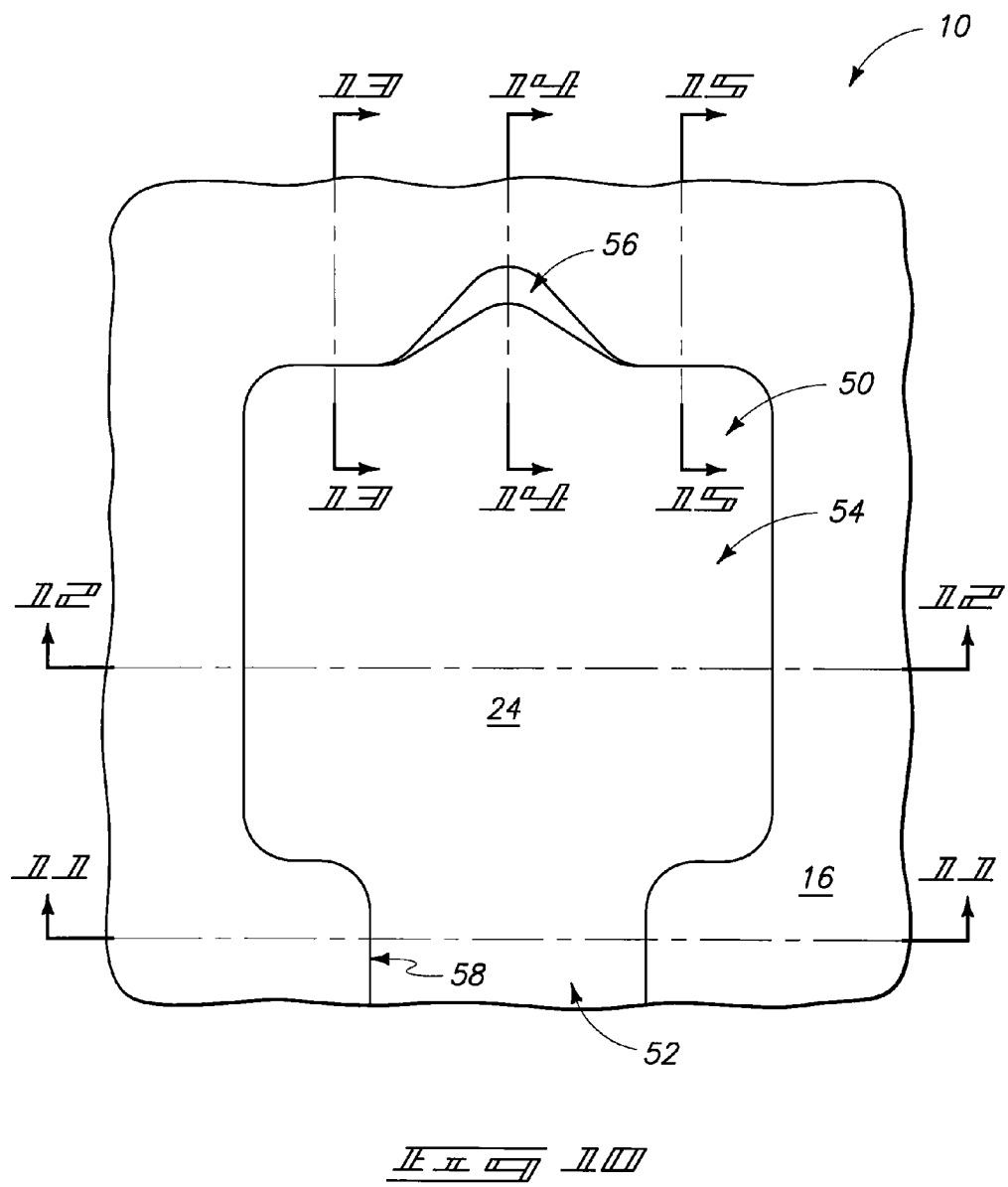
FIGS. 10-15 are a fragmentary top view (FIG. 10) and cross-sectional side views (FIGS. 11-15) of the semiconductor construction of FIGS. 1 and 2 shown at a processing stage subsequent to that of FIGS. 3-8. The cross-sections of FIGS. 11-15 are along the lines 11-11, 12-12, 13-13, 14-14, and 15-15, respectively, of FIG. 10.
Figure 11:
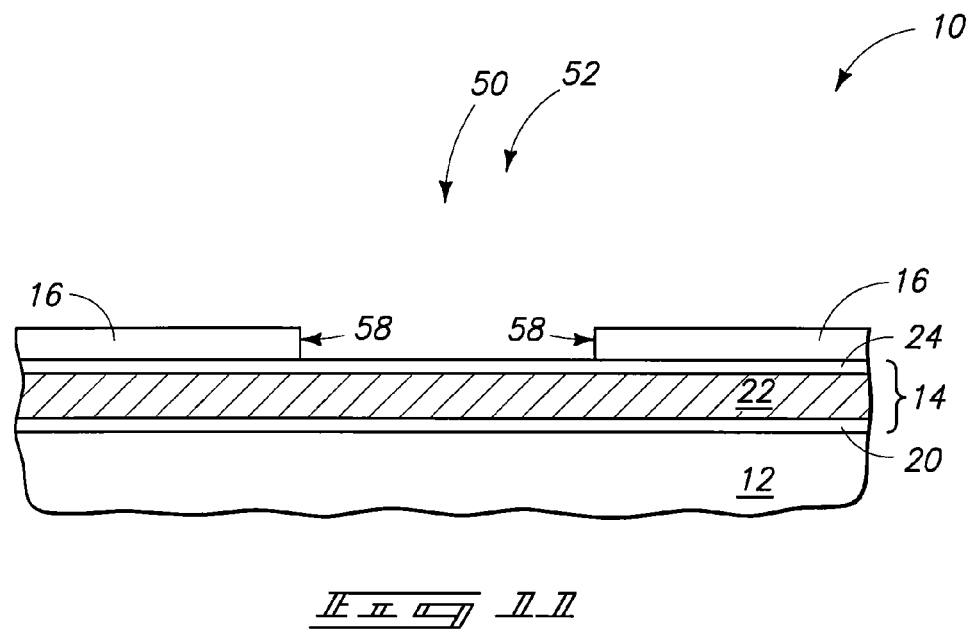
Figure 12:
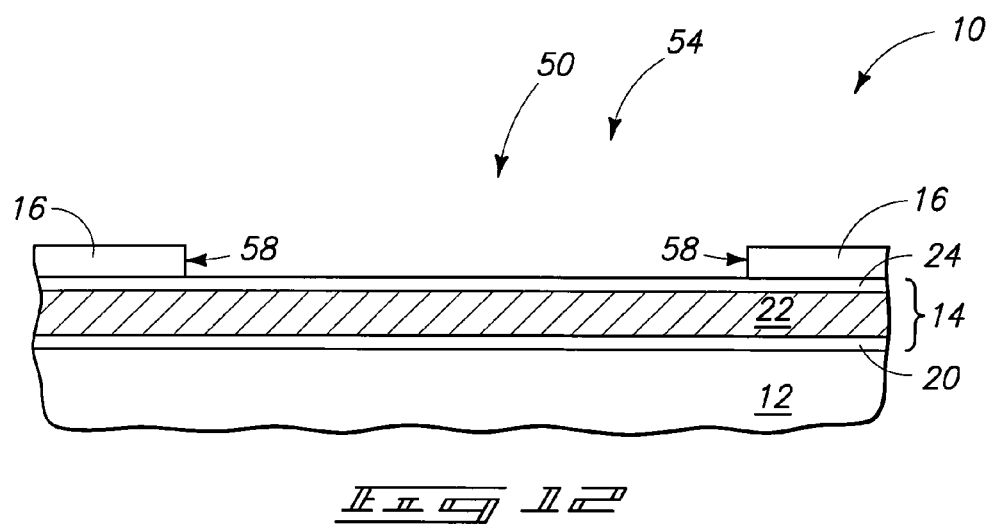
Figure 13:
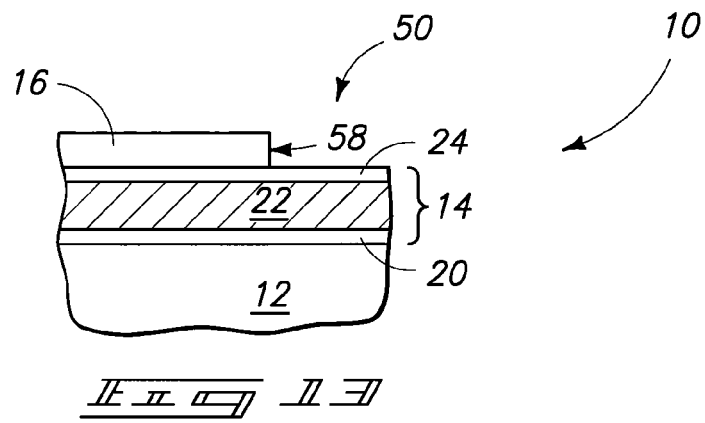
Figure 14:
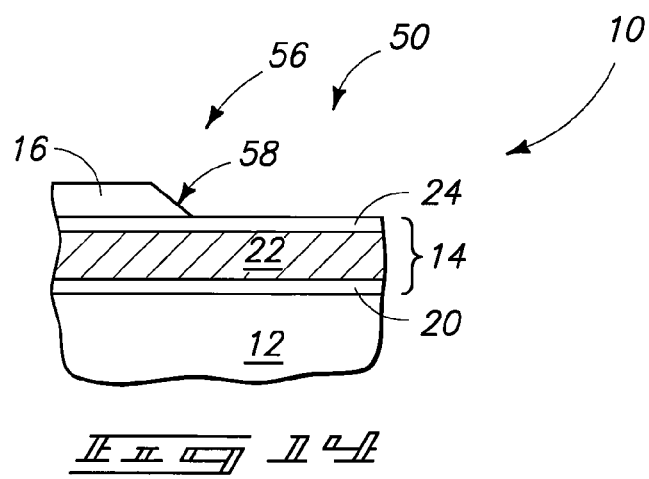
Figure 15:
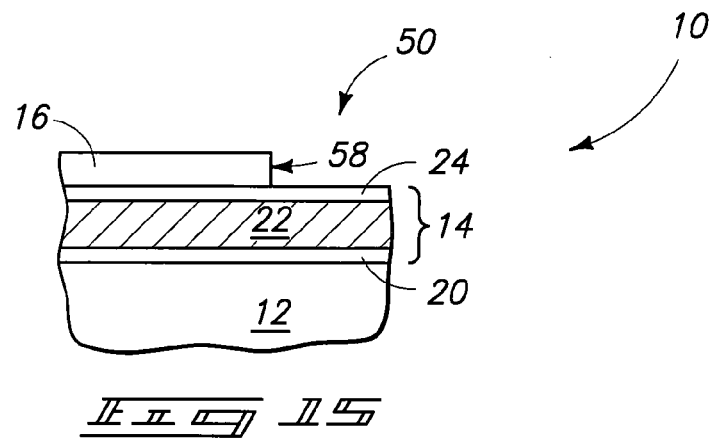
Figure 16:
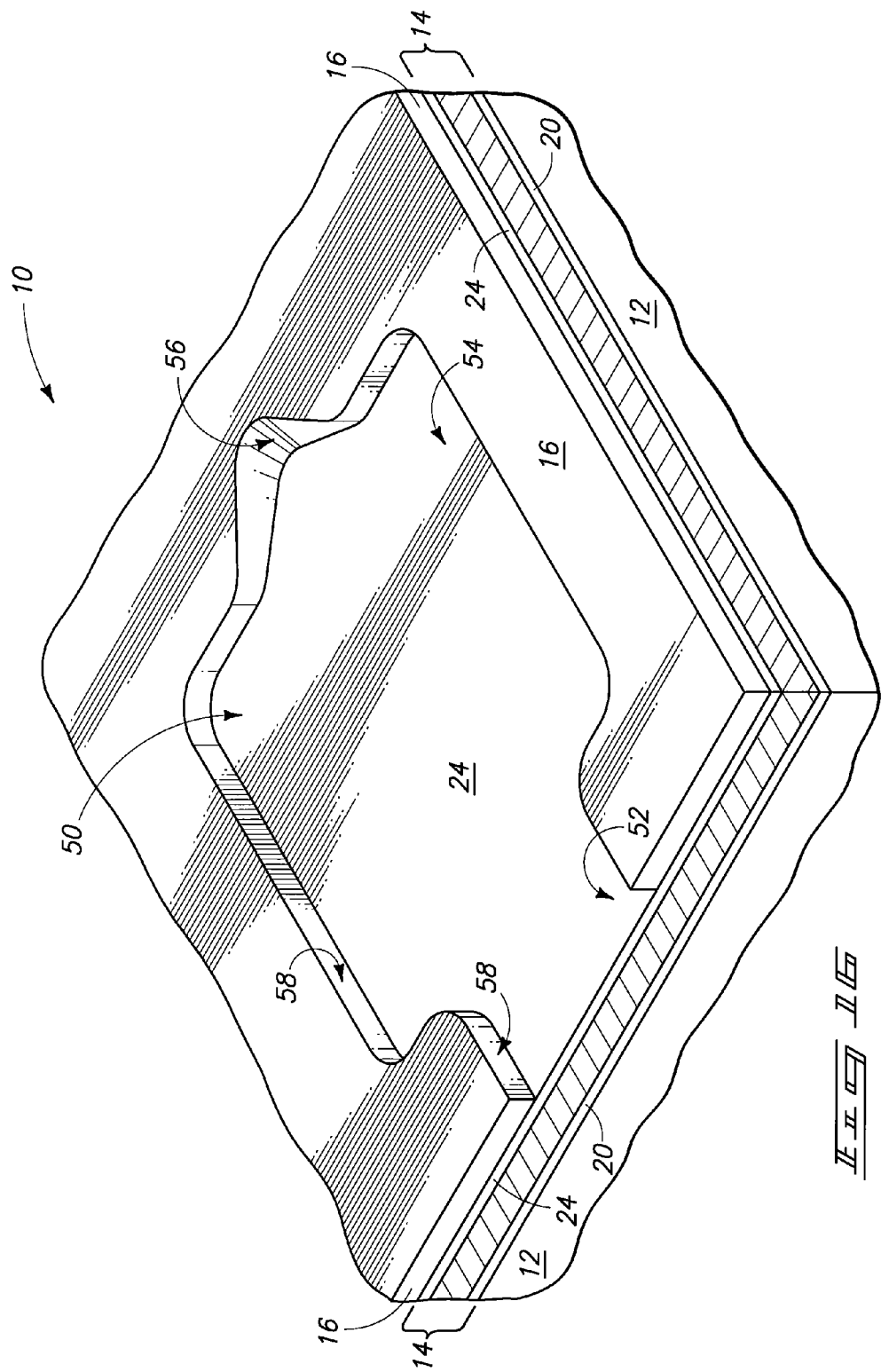
FIG. 16 is a diagrammatic, fragmentary, three-dimensional view of the semiconductor construction of FIGS. 10-15 at the processing stage of FIGS. 10-15.
Figure 17:
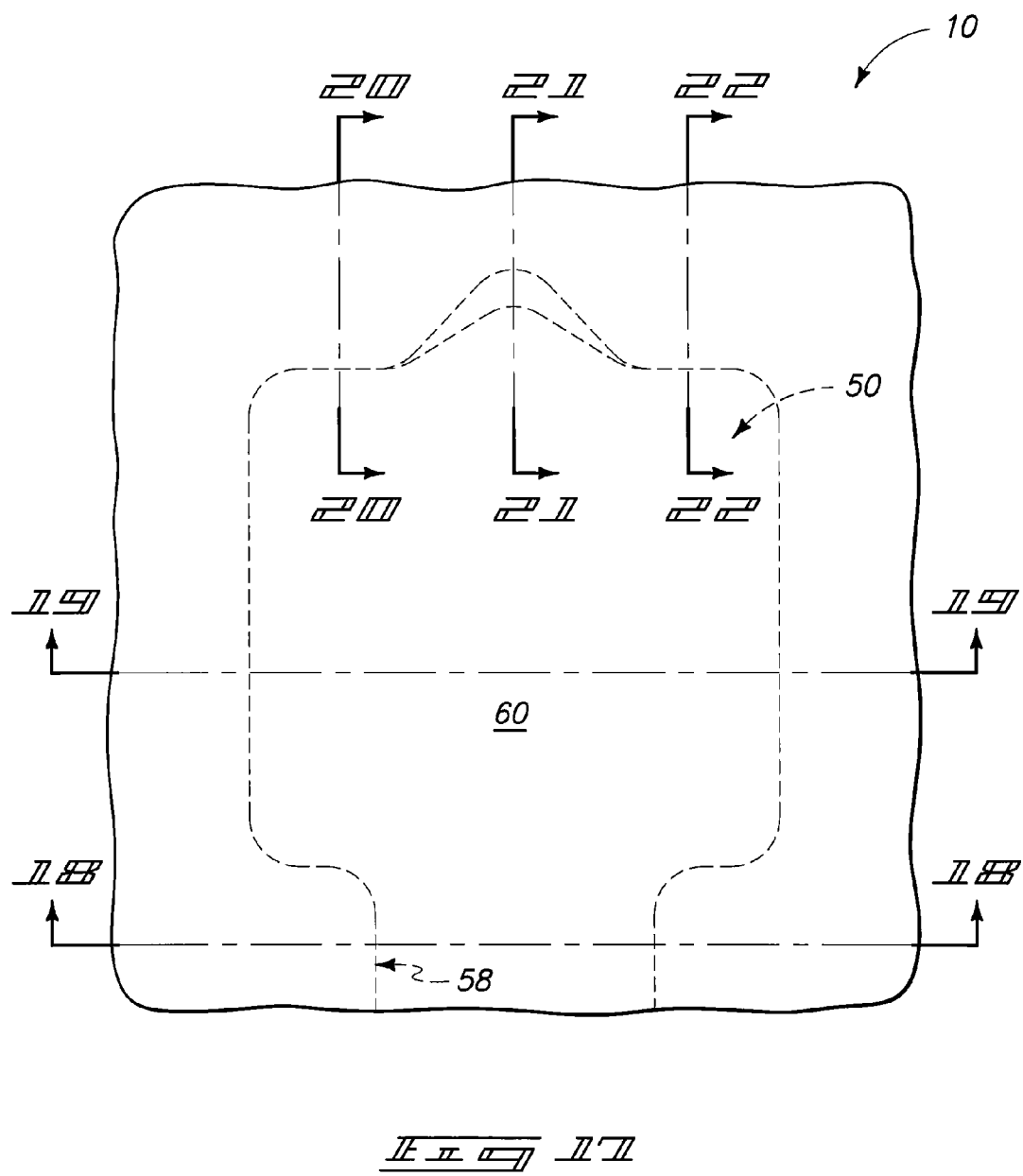
FIGS. 17-22 are a fragmentary top view (FIG. 17) and cross-sectional side views (FIGS. 18-22) of the semiconductor construction of FIGS. 1 and 2 shown at a processing stage subsequent to that of FIGS. 10-15. The cross-sections of FIGS. 18-22 are along the lines 18-18, 19-19, 20-20, 21-21, and 22-22, respectively, of FIG. 17.
Figure 18:
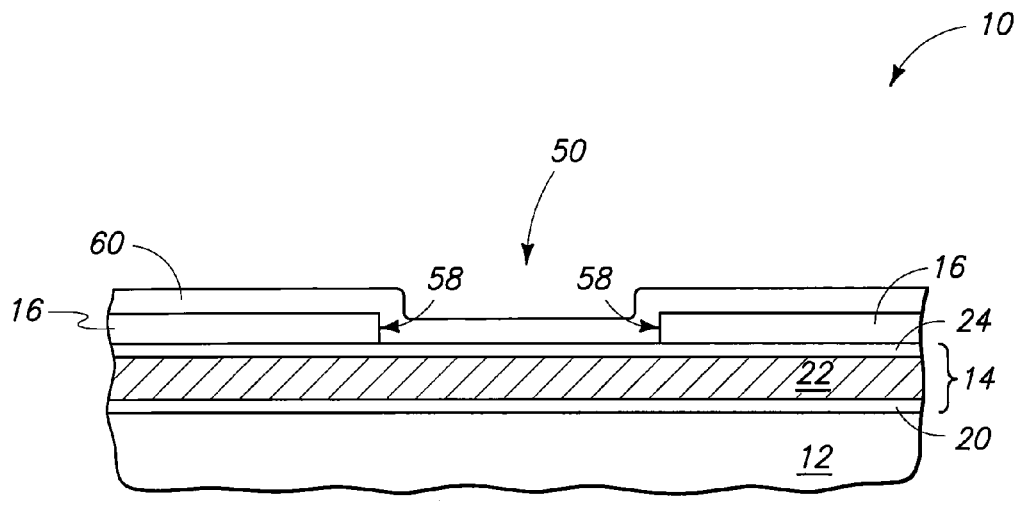
Figure 19:
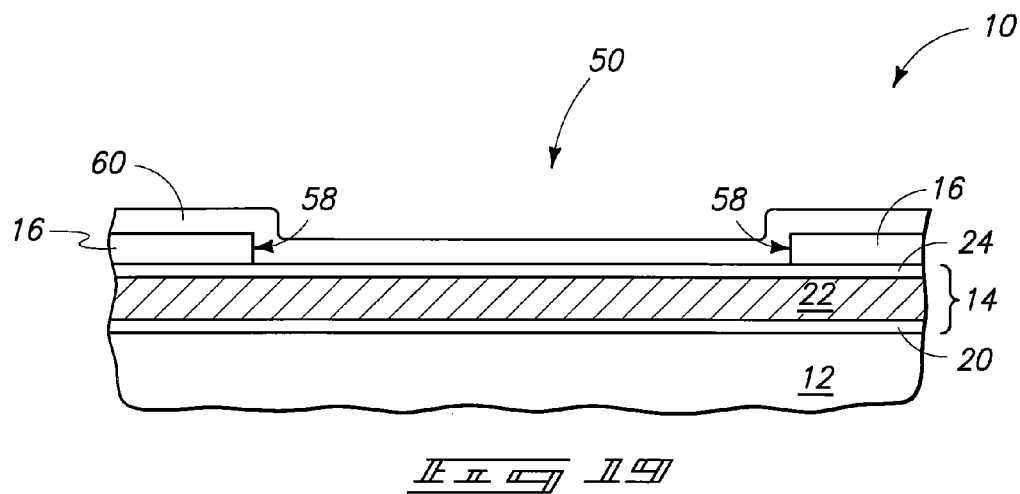
Figure 20:
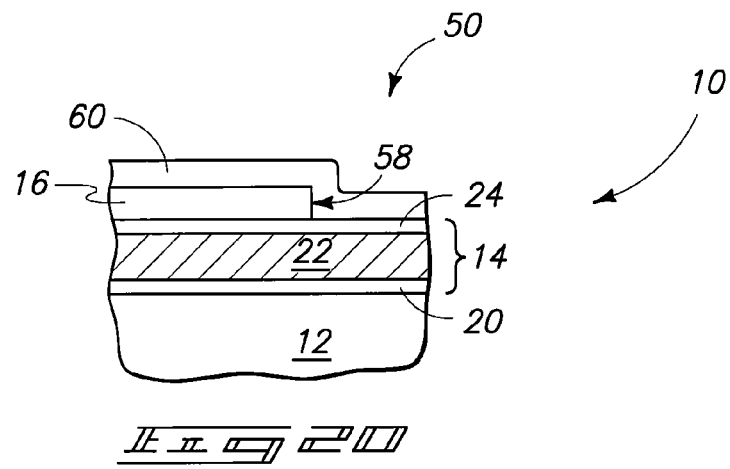
Figure 21:
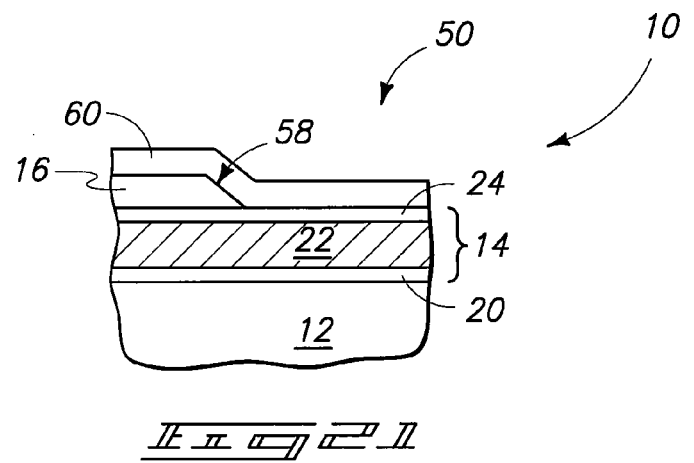
Figure 22:
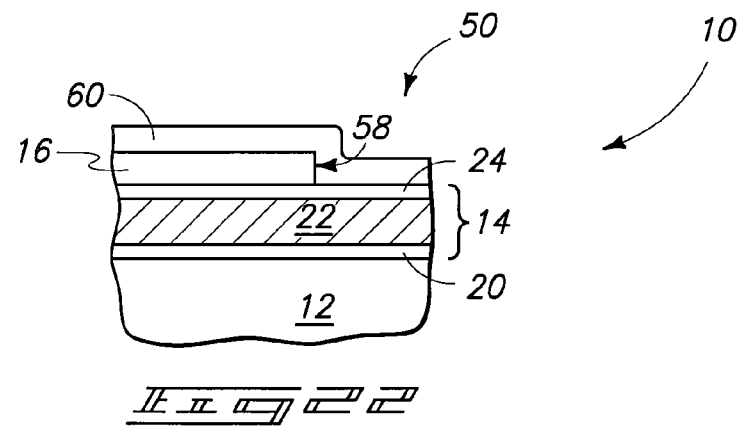

Embodiments include new methods for patterning lines associated with semiconductor constructions. Embodiments also include improvement on previous processes for forming pitch-doubled lines. Such previous processes would have ends of adjacent lines (the adjacent lines could be either electrically conductive lines, or lines of a hard mask material which was ultimately to be used to pattern the electrically conductive lines) undesirably joining to one another, and would then use a mask together with an etch to chop the ends of the adjacent lines and thereby avoid shorting of the electrically conductive lines to one another. Some embodiments may advantageously fabricate adjacent lines without the ends being joined to one another, and thus may eliminate the prior art masking and etch previously utilized to chop the ends of adjacent lines.

An embodiment is described with reference to FIGS. 1-46.

Referring initially to FIGS. 1 and 2, a semiconductor construction 10 is shown at a preliminary processing stage. The construction includes a semiconductor base 12, a gate stack 14 over the base, an expanse of material 16 over the gate stack, and an expanse of photoresist 18 over the material 16.

The semiconductor base may comprise any semiconductor material or combination of materials, and may, for example, correspond to monocrystalline silicon. In some embodiments, base 12 may comprise, consist essentially of, or consist of, for example, monocrystalline silicon lightly-doped with background p-type dopant. The monocrystalline silicon may be, for example, bulk silicon of a wafer, or a layer associated with a silicon-on-insulator construction. In some embodiments, the semiconductor base may be considered to be a semiconductor substrate, or part of a semiconductor substrate. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Although base 12 is shown to be homogenous, it is to be understood that the base may comprise numerous layers in some embodiments. For instance, base 12 may correspond to a semiconductor substrate containing one or more layers associated with integrated circuit fabrication. In such embodiments, such layers may correspond to one or more of metal interconnect layers, barrier layers, diffusion layers, insulator layers, etc.

The gate stack 14 includes, in ascending order from the base, a gate dielectric 20, an electrically conductive gate material 22, and an electrically insulative capping material 24.

The gate dielectric may comprise any suitable composition or combination of compositions, and some embodiments will comprise, consist essentially of, or consist of silicon dioxide.

The electrically conductive gate material may comprise any suitable composition or combination of compositions, and in some embodiments will comprise one or more of metal, metal compositions, and/or conductively-doped semiconductor material (such as, for example, conductively-doped silicon).

The electrically insulative capping material may comprise any suitable composition or combination of compositions, and in some embodiments will comprise, consist essentially of, or consist of one or more of silicon dioxide, silicon nitride, and silicon oxynitride. In some embodiments, the capping material may consist essentially of, or consist of silicon dioxide, and accordingly may have an uppermost surface consisting essentially of, or consisting of silicon dioxide. The stack 14 may be utilized to form wordlines, and accordingly may be referred to as a wordline stack. In some embodiments, the capping material may be omitted from the wordline stack at the processing stage of FIGS. 1 and 2.

Material 16 may comprise any suitable composition or combination of compositions, and in some embodiments will comprise, consist essentially of, or consist of carbon, such as transparent carbon. In such embodiments, the carbon of material 16 may be directly against silicon dioxide of capping material 24.

As discussed above, the term "semiconductor substrate" may be utilized in this document to refer to a single semiconductor material, or to refer to a structure containing semiconductor material in combination with other materials. Thus, in some embodiments, the structure comprising layers 20, 22 and 24 in combination with semiconductor material base 12 may be referred to as a semiconductor substrate. In such embodiments, the semiconductor substrate may be understood to have an uppermost region comprising layer 24, and the material 16 may be considered to be formed over such uppermost region.

Referring next to FIGS. 3-8, an opening 30 is photolithographically patterned into photoresist 18. In other words, opening 30 is formed by exposing photoresist 18 to patterned radiation, and subsequently developing the photoresist to remove either exposed or unexposed regions (depending on whether the photoresist is a positive resist or a negative resist). Although the shown embodiment forms an opening 30, it is to be understood that other embodiments form the negative image of the shown embodiment (i.e., form an island of photoresist).

Opening 30 comprises a shape of an alley (or stem) 32 extending into a widened closed-end terminus 34. The terminus may be referred to as a cul-de-sac or bulbous region. Although the bulbous region is wider than the alley in the shown embodiment, it is to be understood that the bulbous region may be narrower than the alley in other embodiments. The terminus comprises a projecting region 36 which, in the shown embodiment, projects outwardly of the terminus. In other embodiments, the projecting region may project inwardly of the terminus.

The opening has a lateral boundary (or periphery) defined by a sidewall 38. The cross-sections of FIGS. 4-8 show that such sidewall is steep around most of the periphery, but is shallow within projecting region 36. Such as further illustrated in a three-dimensional view of FIG. 9.

In some embodiments, the alley 32 and projecting region 36 may be considered to be on a pair of opposing ends of opening 30, and the opening may be further considered to comprise a pair of opposing sides 40 and 42 extending from one of the ends to the other. In such embodiments, the periphery of the opening may be considered to have steep sidewalls along the sides 40 and 42, and to have a shallow region (within projecting region 36) which joins to, and extends between, the steep sidewalls.

Photoresist 18 may be considered to comprise a topography at the processing stage of FIGS. 3-9. Such topography may be considered to have a first degree of slope at the steep sidewalls, and a second degree of slope at the shallow sidewall region within projecting region 36. The second degree of slope is less than the first degree of slope.

Exemplary methods for forming opening 30, or analogous openings, are described with reference to FIGS. 47-50 below. Although only one opening is shown and described in FIGS. 3-9, it is to be understood that multiple openings could be, and typically would be, simultaneously formed and processed across a semiconductor wafer.

Referring next to FIGS. 10-16, the topography of patterned resist 18 (FIGS. 3-9) is transferred to underlying material 16 with any suitable etch or combination of etches, and subsequently resist 18 remaining over material 16 is removed. The transfer of the topography from the photoresist to the underlying material may be accomplished by, for example, utilizing etching that removes some of the photoresist as the etching progresses. Thus, portions of the material not covered by any photoresist are exposed to etching for the full duration of the etch, portions covered by shallow regions of photoresist become exposed to the etching conditions at some point during the duration of the etch when the shallow regions of photoresist have been removed by the etch, and portions covered by thick regions of photoresist do not become exposed to the etching conditions. An example etch for transferring the pattern into carbon may use $SO_2$ and $O_2$.

The transfer of topography from the photoresist to underlying material 16 forms an opening 50 within material 16. Such opening, analogously to the opening 30 discussed above, has a shape of an alley (or stem) 52 extending into a widened terminus 54 having a projecting region 56. The opening 50 further has a lateral boundary defined by a sidewall 58, which, as shown in FIGS. 11-16, mimics the topography of the periphery of opening 30 (FIGS. 3-9). Thus, sidewall 58 is steep around most of the lateral boundary, but shallow within projecting region 56.

The topography of material 16 at the processing stage of FIGS. 10-16, may be considered, analogously to the topography of the patterned photoresist 30 used to pattern material 16, to have a first degree of slope at the steep sidewalls and a second degree of slope at the shallow sidewall region within projecting region 56, with the second degree of slope being less than the first degree of slope.

Referring to FIGS. 17-22, a material 60 is formed over material 16 and within opening 50. Material 60 conformally overlays the topography of material 16, and in the shown embodiment is formed directly against material 60. The sidewall 58 of opening 50 is shown in dashed-line view in the top view of FIG. 17 to indicate that such sidewall is under material 60.

Material 60 may comprise any suitable composition or combination of compositions; and may, for example, comprise, consist essentially of, or consist of silicon nitride.

Materials 16 and 60 may be referred to as first and second materials, respectively, to distinguish the materials from one another. Further, materials 16 and 60 may be considered to be masking layers, and accordingly may be referred to as first and second masking materials, respectively.

Referring next to FIGS. 23-28, material 60 is anisotropically etched. The anisotropic etching removes material 60 from over the shallow regions of sidewall 58 (with such shallow sidewall regions being along the projecting portion 56 of the opening 50 as discussed above) while forming lines of material 60 along the steep regions of sidewall 58. The steep regions of sidewall 58 may be considered to have a degree of slope greater than a threshold degree, while the shallow region of the sidewall has a degree of slope less than the threshold degree; with such threshold degree being an amount of slope which will lead to formation of a line of material 60 along the sidewall during the anisotropic etching rather than removal of the material 60 by the anisotropic etching conditions.

Figure 23:
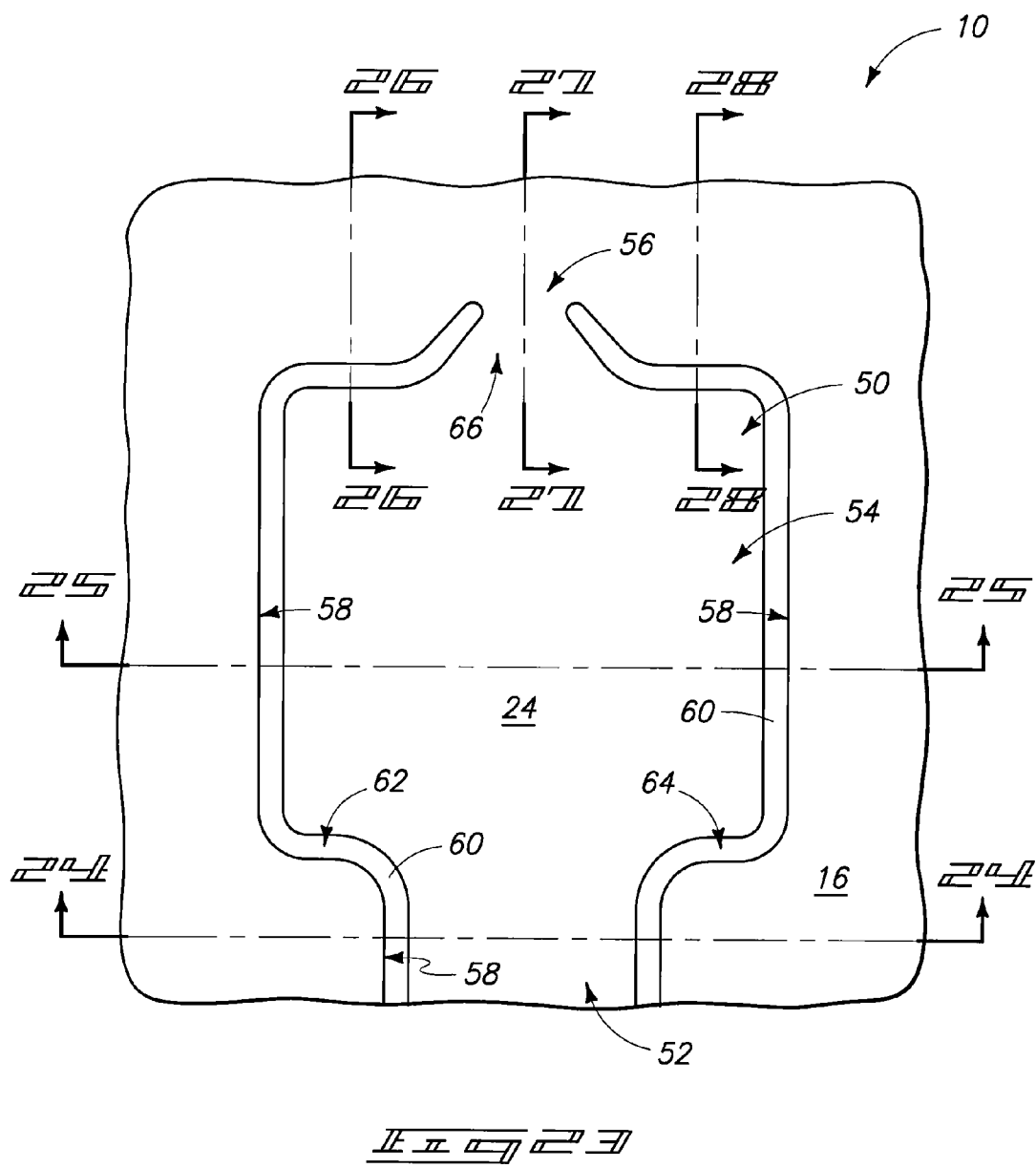
Figure 24:
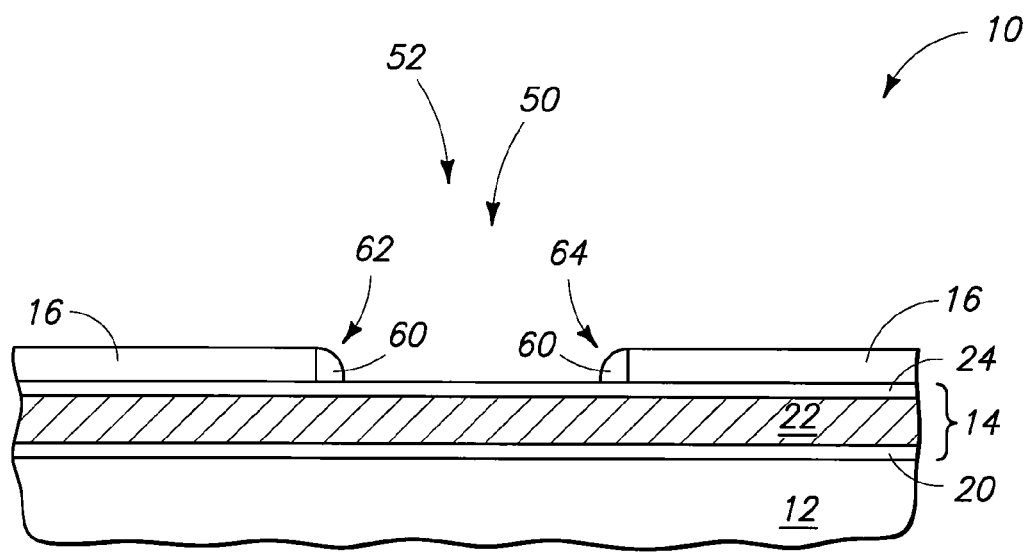
Figure 25:
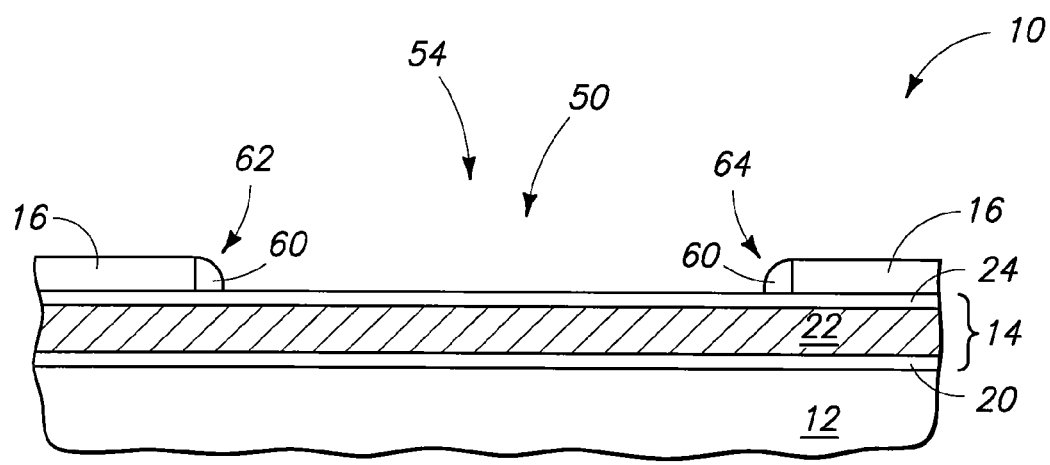
Figure 29:
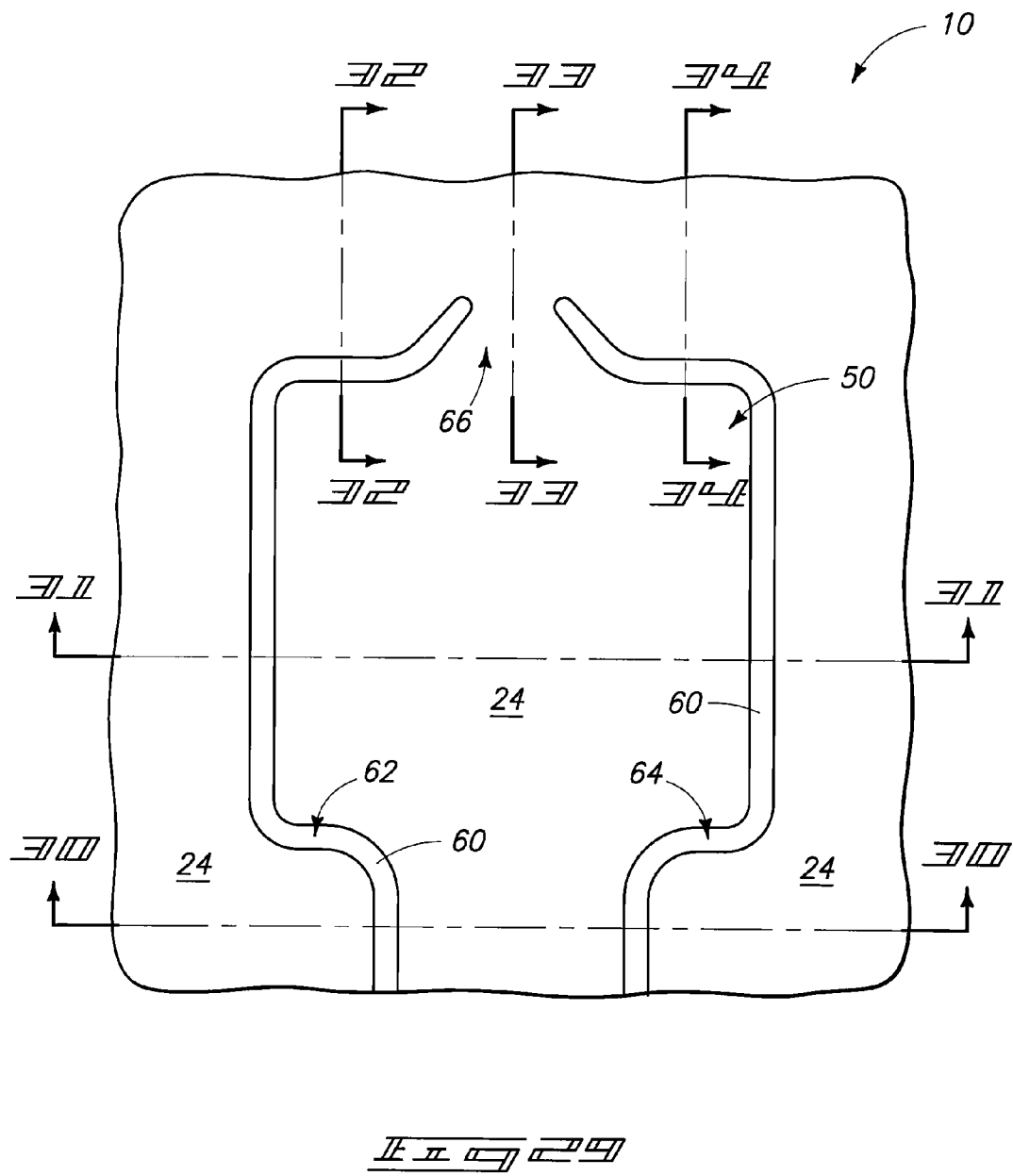
FIGS. 29-34 are a fragmentary top view (FIG. 29) and cross-sectional side views (FIGS. 30-34) of the semiconductor construction of FIGS. 1 and 2 shown at a processing stage subsequent to that of FIGS. 23-28. The cross-sections of FIGS. 30-34 are along the lines 30-30, 31-31, 32-32, 33-33, and 34-34, respectively, of FIG. 29.
Figure 30:
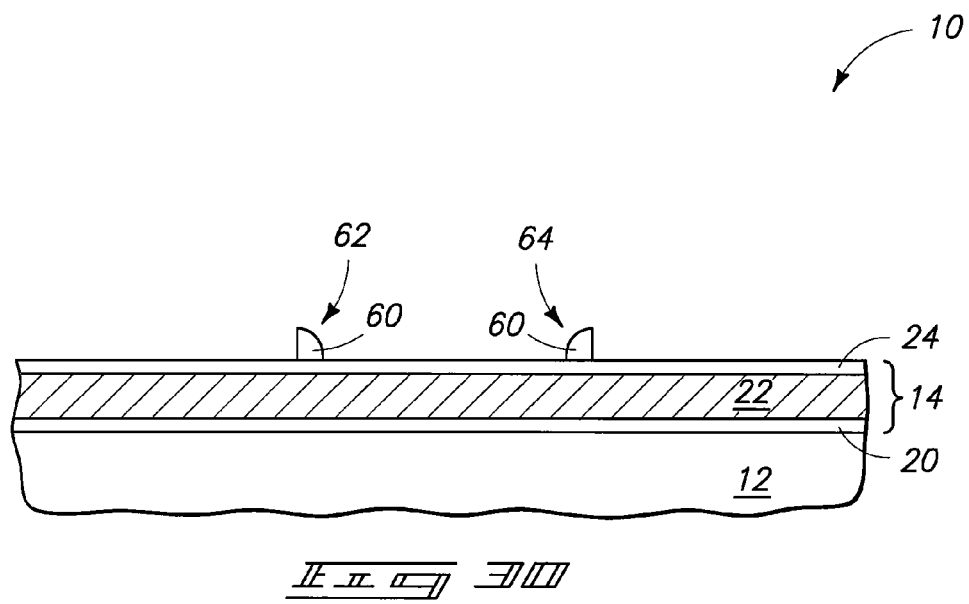
Figure 31:
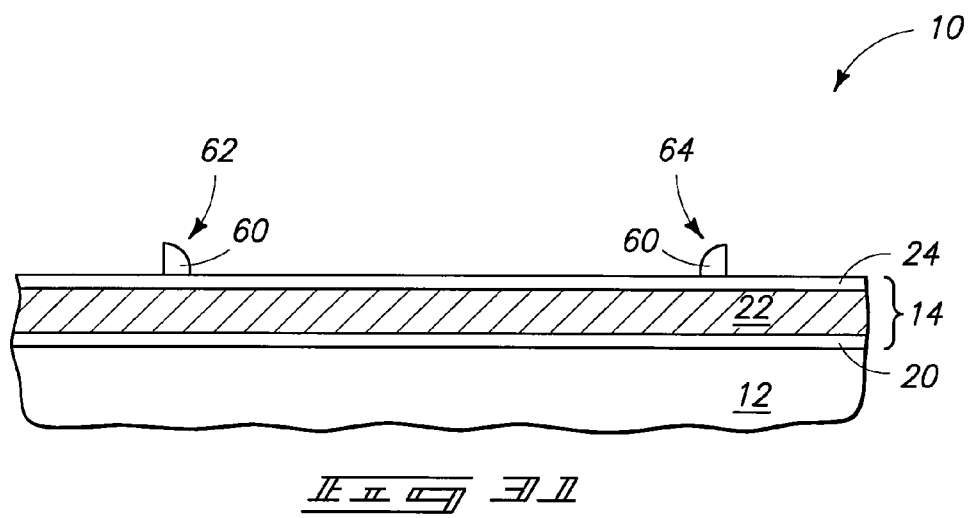
Figure 32:
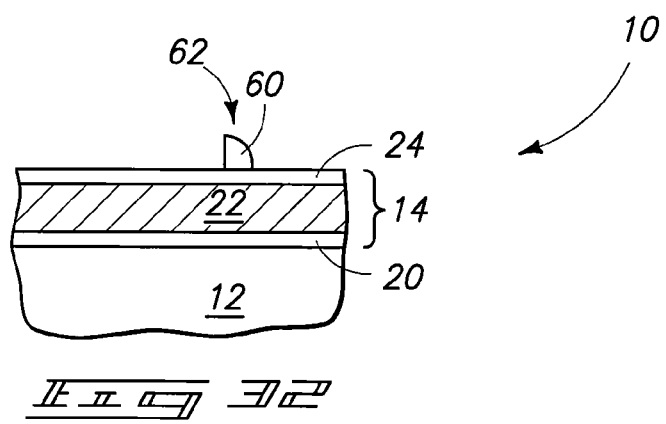
Figure 33:
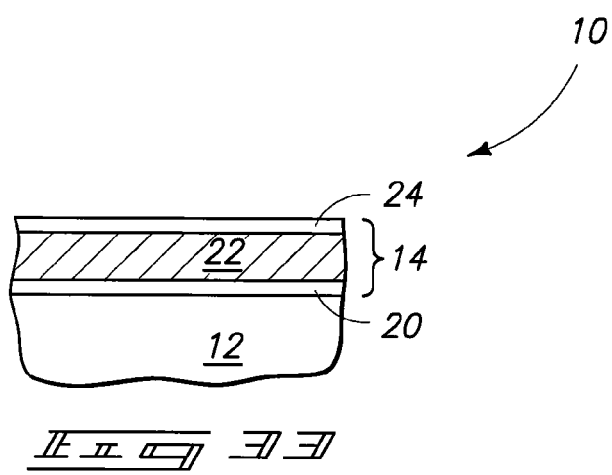
Figure 34:
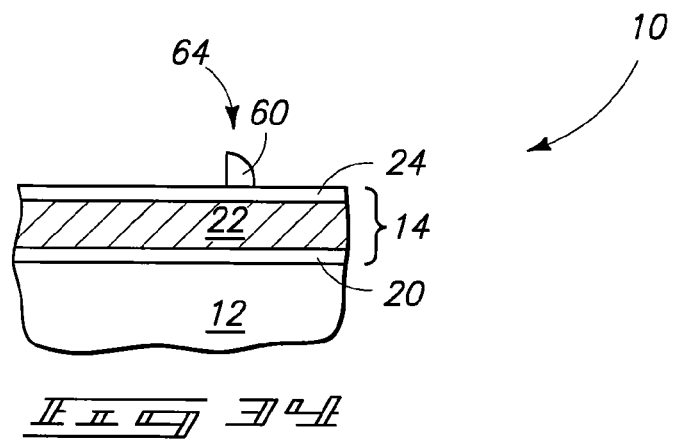
Figure 35:
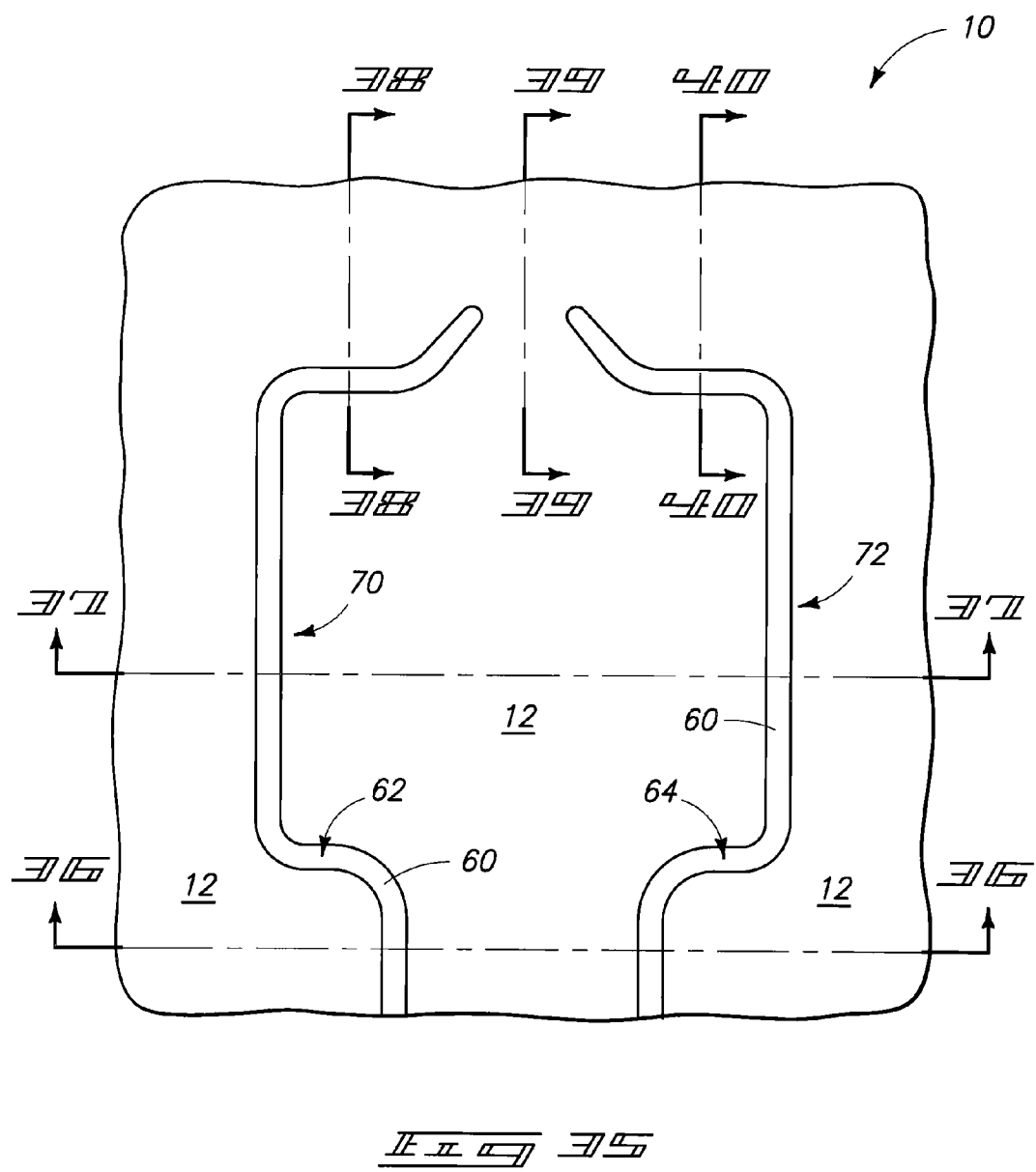
Figure 36:
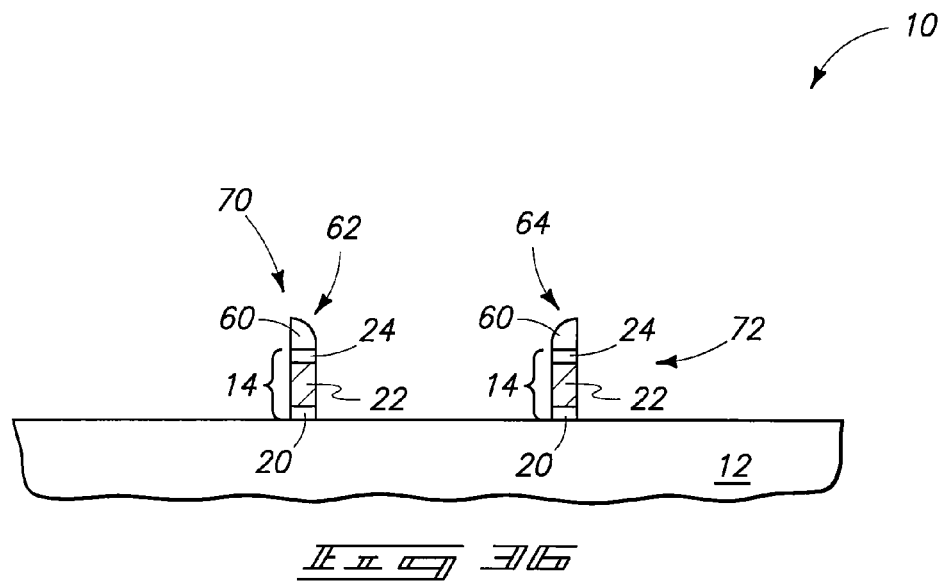
Figure 37:
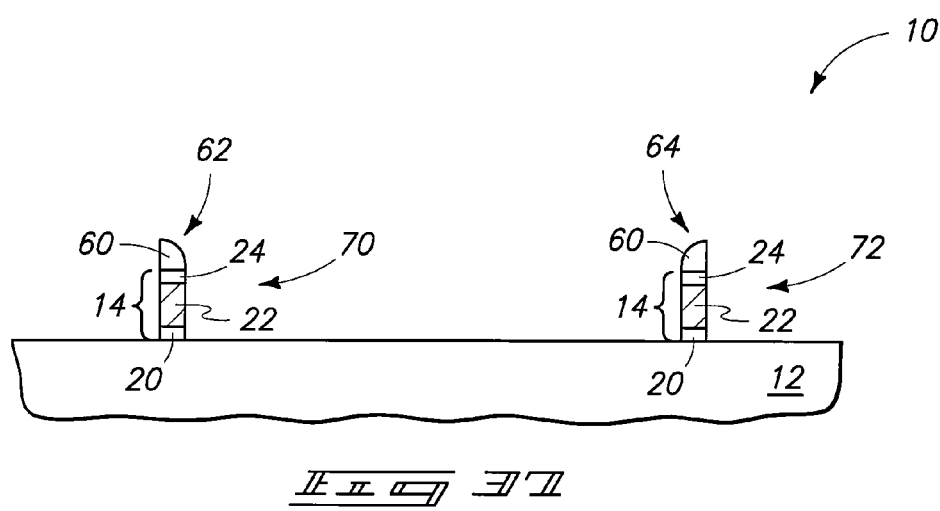
Figure 41:
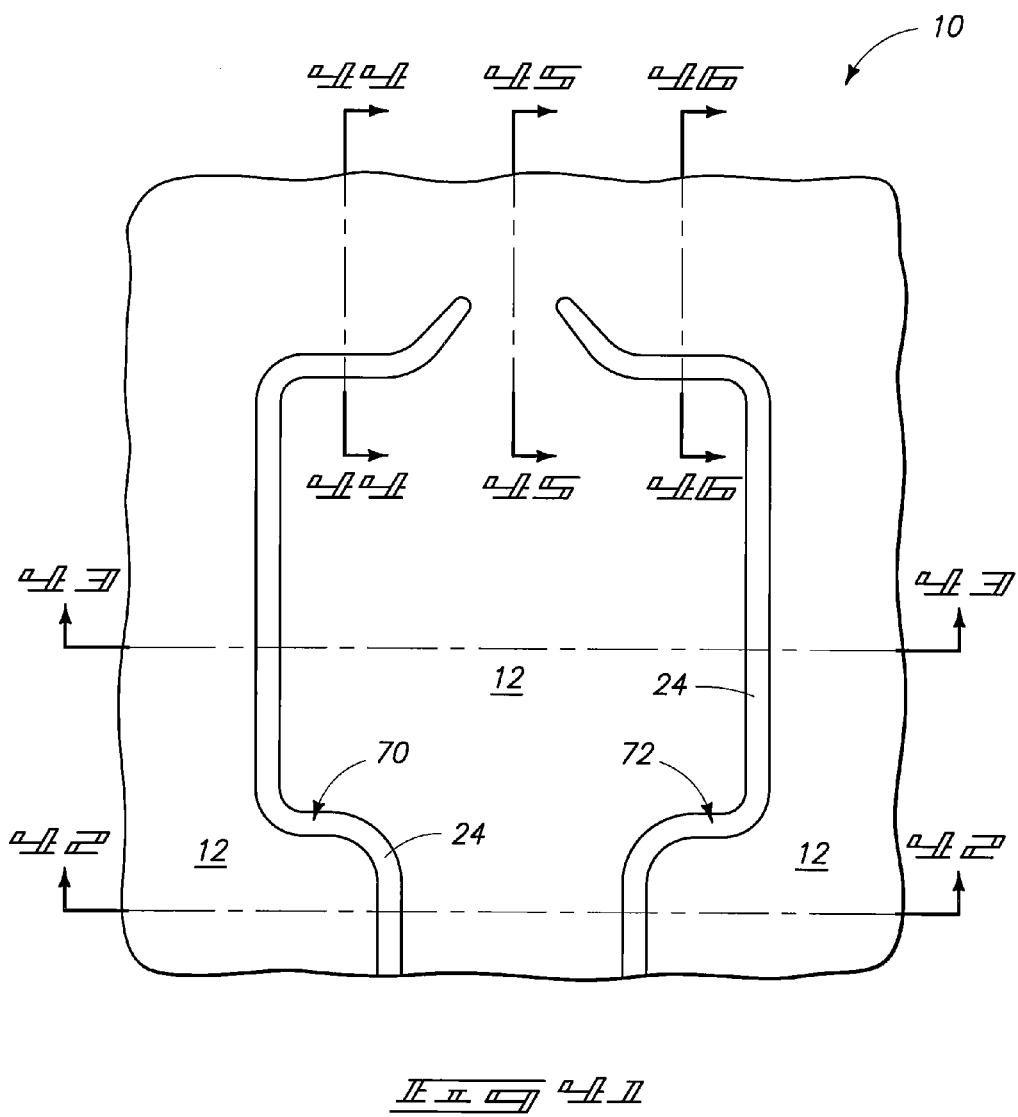
Figure 44:
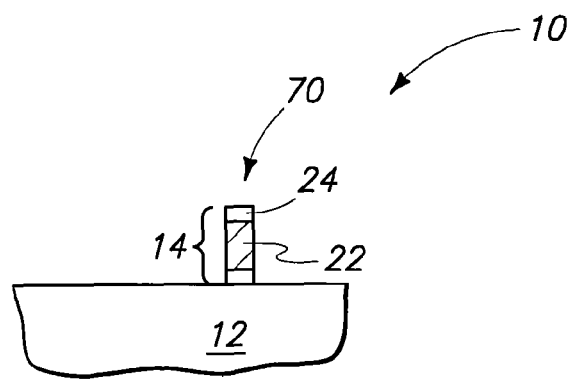
Figure 45:
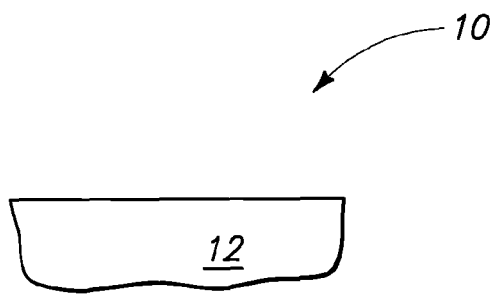
Figure 46:
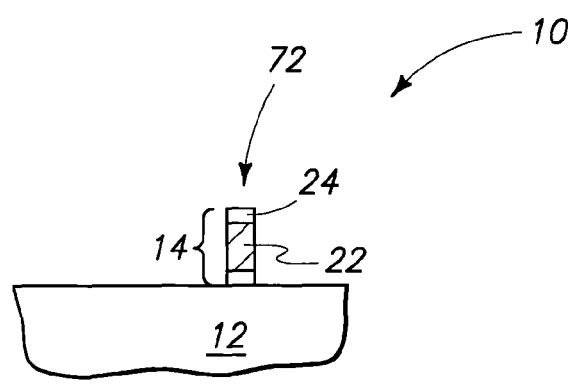

The anisotropically etched material 60 of FIG. 23 may be considered to form a pair of lines 62 and 64 which extend along the opposing sides of the alley region 52 of opening 50, more than halfway around the closed terminus (or cul-de-sac) region 54 of the opening 50; and which are spaced from one another by a gap 66 along the shallow sidewall region of the opening.

Referring next to FIGS. 29-34, material 16 (FIGS. 23-28) is removed selectively relative to material 60. For purposes of interpreting this disclosure, a first material is to be understood as being removed selectively relative to a second material if the first material is removed at a faster rate than the second material, which may include, but is not limited to, processes which are 100% selective for the first material relative to the second material.

The lines 62 and 64 of material 60 remain across construction 10 as a hard mask.

Referring next to FIGS. 35-40, the pattern of material 60 is transferred into underlying materials 20, 22 and 24 with one or more suitable etches to form lines 70 and 72 from the gateline stack 14. Although the etching is shown extending through all of the materials 20, 22 and 24; in other embodiments, gate dielectric 20 is not patterned into the lines comprising materials 22 and 24. An example etch for etching into a poly stack may use HBr.

Referring to FIGS. 41-46, material 60 (FIGS. 35-40) is removed. The remaining lines 70 and 72 may correspond to wordlines. Such may be incorporated into memory arrays utilizing methodologies known to those of ordinary skill in the art. For instance, isolation (not shown) may be provided at various locations under the wordlines, source/drain diffusion regions (not shown) may be formed within substrate 12 proximate the wordlines, and transistor gates may be comprised by the wordlines and utilized to gatedly connect pairs of the source/drain regions in transistor constructions. Capacitors (not shown) or other charge storage may be provided in association with the transistors to form an array of DRAM (dynamic random access memory) unit cells. Methodology disclosed herein may also be utilized to form FLASH by utilizing floating gates that are part of the wordline stack. The memory arrays and/or FLASH may be incorporated into any of various electronic systems, including, for example, cars, airplanes, telephones, cameras, etc.

Figure 47:
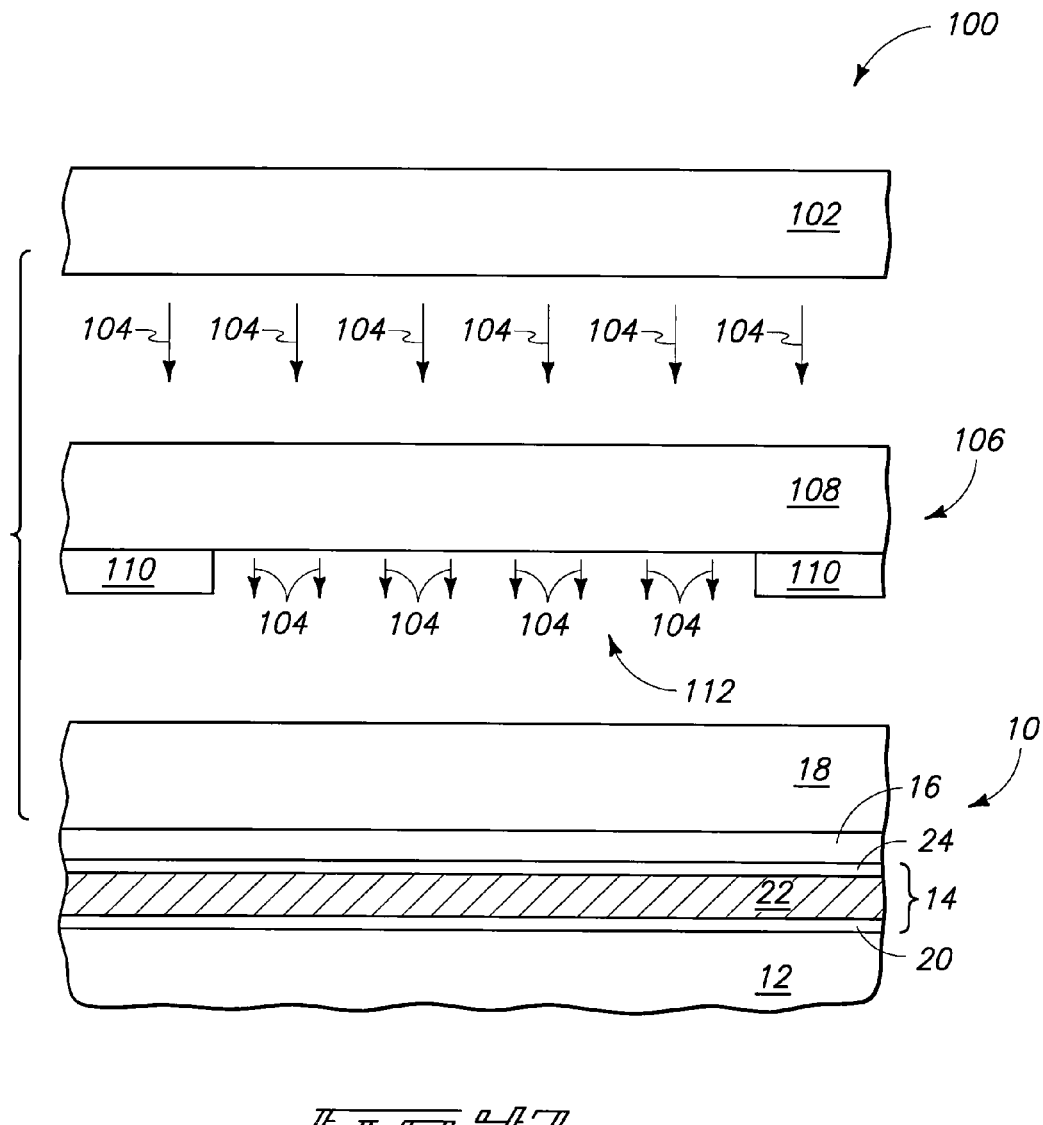
FIG. 47 is a diagrammatic, cross-sectional, fragmentary view of a system configured for providing patterned radiation to photoresist during a photolithographic process.

As discussed above, the patterning of the photoresist 18 to form the construction of FIGS. 3-9 may be accomplished by exposing the photoresist to an appropriate pattern of radiation, followed by development of the resist. FIG. 47 shows a system 100 configured to expose the photoresist 18 of construction 10 to patterned radiation. The system includes a radiation source 102 which projects radiation 104 toward photoresist 18. The system also includes a reticle 106 which patterns the radiation so that the radiation reaches photoresist 18 in a desired pattern.

The reticle 106 comprises a substrate 108, relatively opaque regions 110 joined to the substrate, and a window 112 extending through the opaque regions. The radiation 104 passes through substrate 108, and through window 112; and is blocked by relatively opaque regions 110. Thus, the shape of window 112 may impart a pattern to the radiation.

Window 112 may be referred to as a feature associated with the reticle. Any suitable feature may be utilized for forming photoresist topographies appropriate for the various embodiments. Example feature configurations are shown in FIGS. 48-50.

Figure 48:
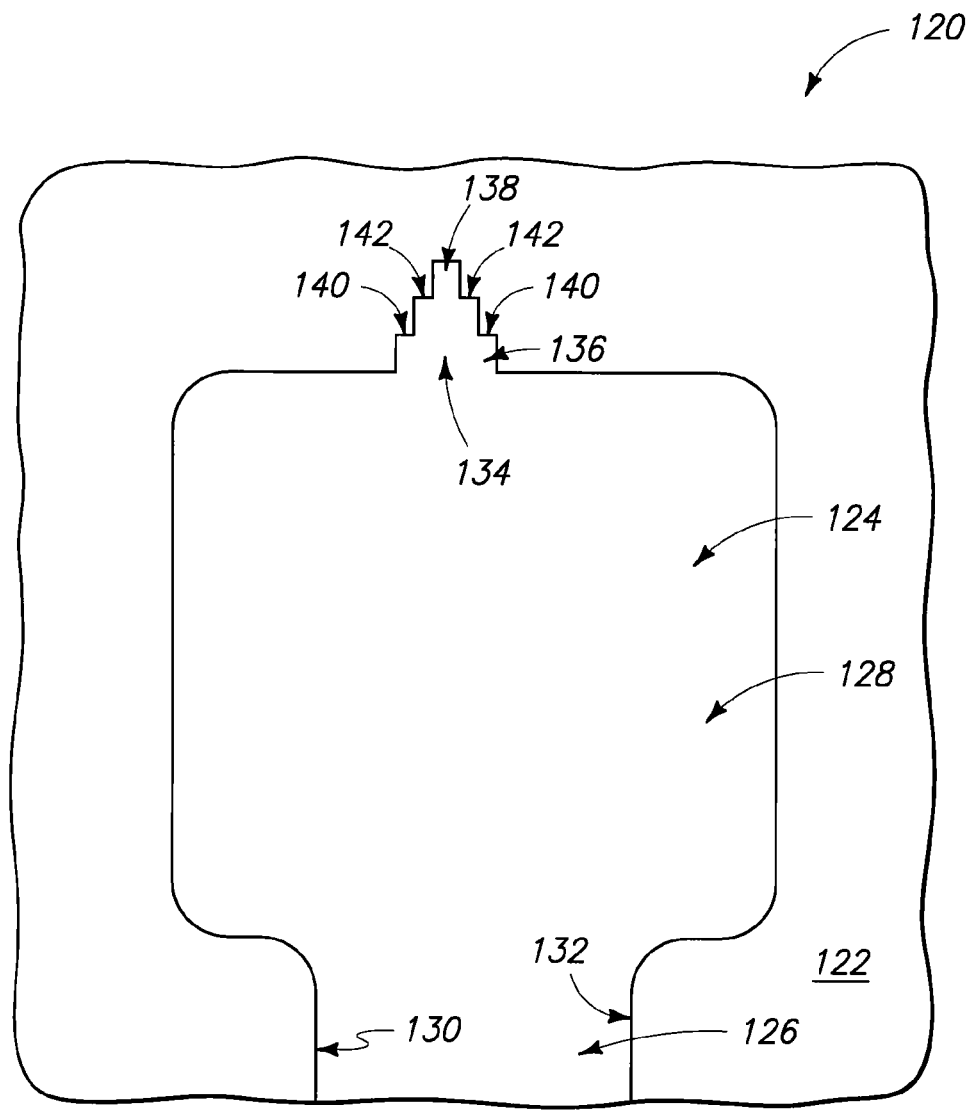
FIG. 48 is a diagrammatic, fragmentary top view of a reticle which may be utilized in some embodiments.

Referring to FIG. 48, such illustrates a reticle 120 comprising a relatively opaque region 122 and a feature 124 patterned through the opaque region. Such feature may be utilized to pattern openings in photoresist similar to the opening 30 shown in FIGS. 3-9. Feature 124 comprises an alley (or stem) 126 joining to a closed end 128 corresponding to a bulbous terminus (or cul-de-sac). The feature comprises a pair of sidewalls 130 and 132 that extend from the alley 126 around an interior of the closed end to a projecting region 134. The projecting region comprises at least a portion which is too small to be directly patterned on the photoresist, and which instead creates interference to cause partial (or incomplete) patterning relative to the patterning imparted by the rest of the feature. In other words, projecting region 134 may be considered to be an interference region which causes a lower exposure dose of radiation to be imparted to a portion of photoresist than the dose imparted by other portions of the feature. This lower exposure dose forms an exposure pattern of the shallow sidewall region 36 of FIG. 3, while the remainder of the feature forms the exposure pattern of the rest of the opening 30 of FIG. 3, including the steep regions of sidewalls 38. After the reticle is used to impart the exposure the pattern into the photoresist, the photoresist may be developed to form the opening 30 therein.

In the shown embodiment, interference region 134 is a peninsula extending outwardly from the closed end 128 of feature 124. Such peninsula has a wide portion 136 projecting outwardly to a narrow portion 138. The peninsula further comprises stepped terraces 140 and 142 where narrowing occurs in going from the wide portion to the narrow portion. The peninsula may be considered to comprise a sort of "V" shape, in that it goes from a wide region to a narrow region. At least narrow portion 138 is too small to be directly patterned onto photoresist. In some embodiments, such narrow portion may have a width less than the wavelength of radiation passed through the feature during patterning of photoresist. In such embodiments, the wide may be wider than the wavelength of radiation, or narrower than the wavelength of radiation.

Figure 49:
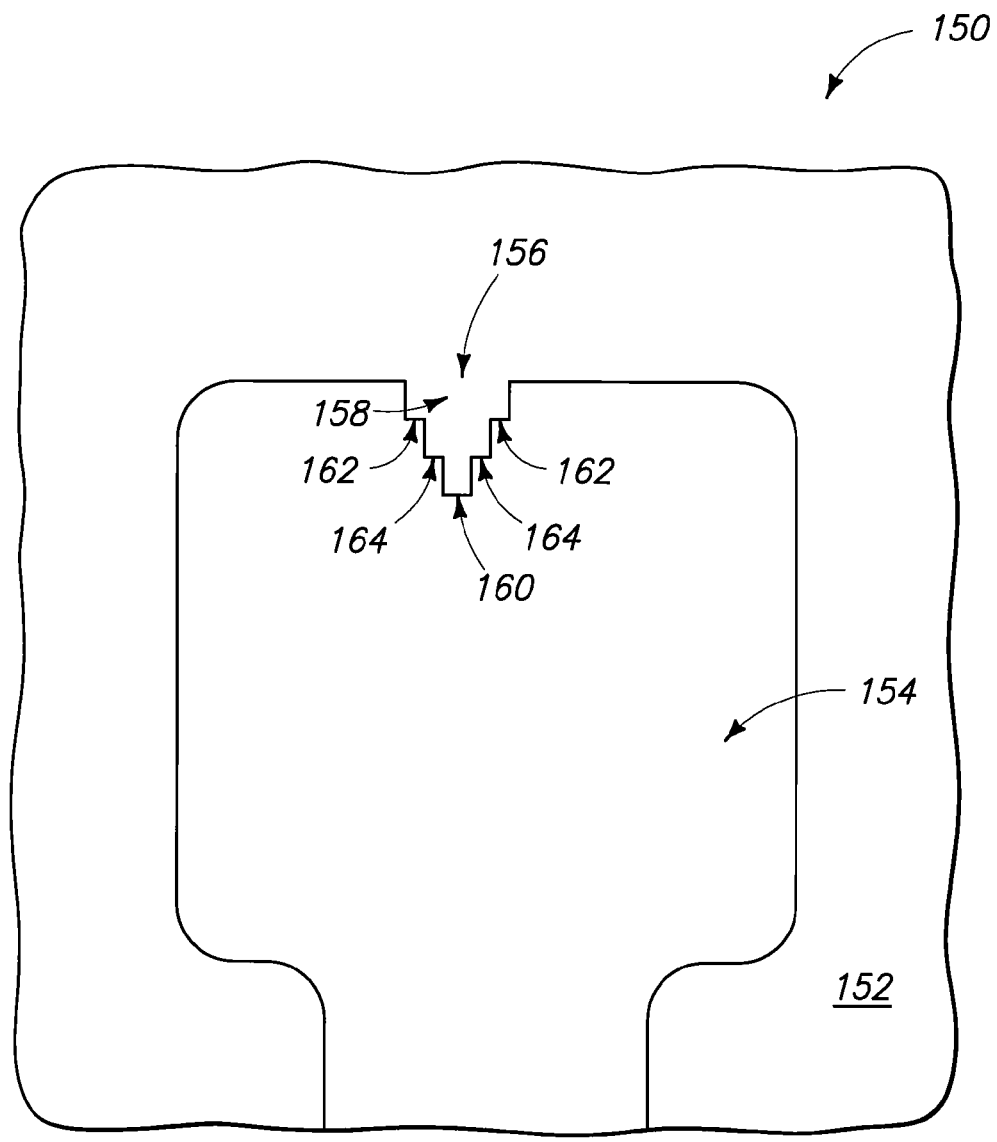
FIG. 49 is a diagrammatic, fragmentary top view of another reticle which may be utilized in some embodiments.
Figure 50:
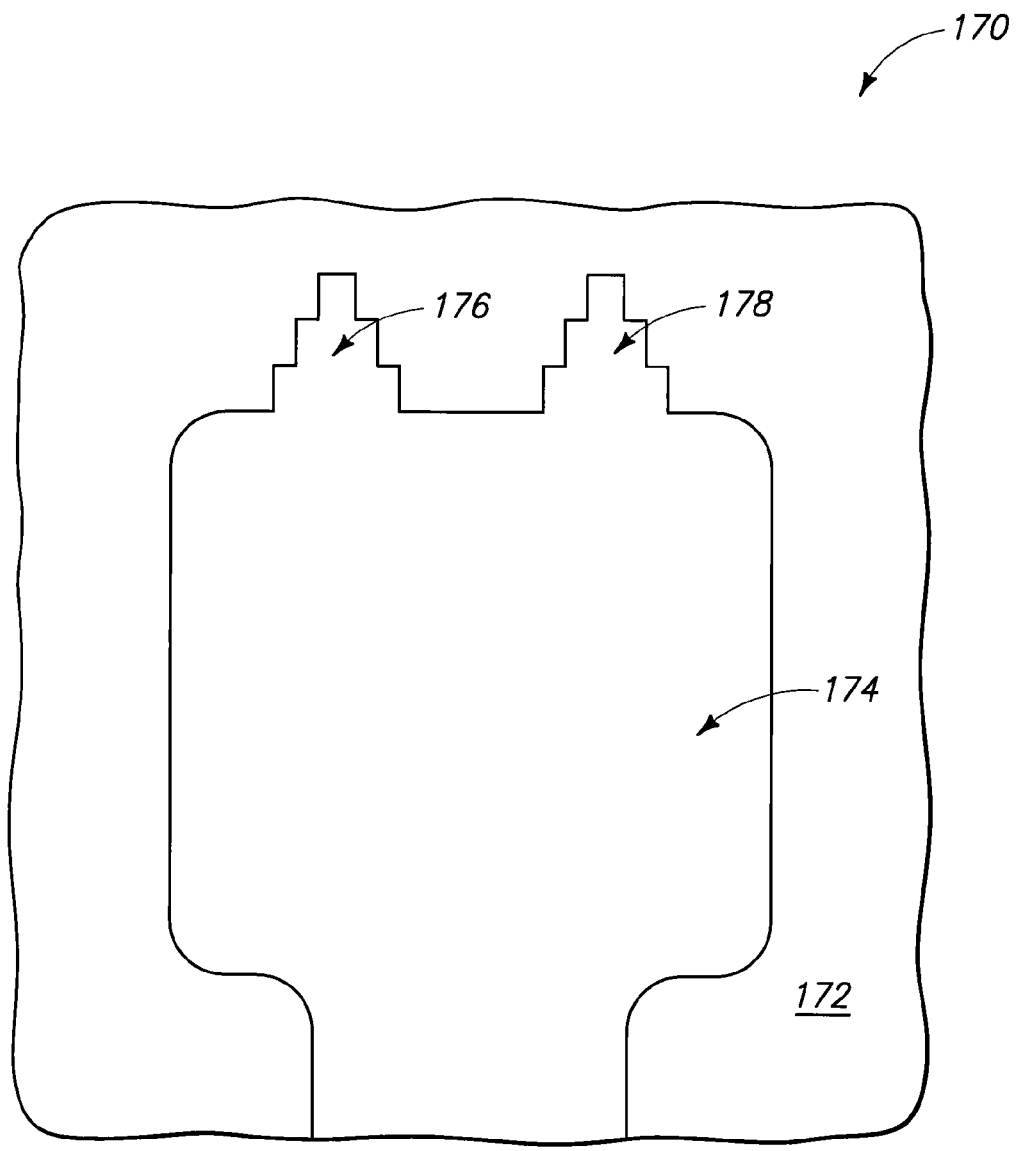
FIG. 50 is a diagrammatic, fragmentary top view of yet another reticle which may be utilized in some embodiments.

FIG. 49 shows another reticle 150 which may be utilized in some embodiments. Reticle 150 comprises a relatively opaque region 152 and a feature 154 patterned through the opaque region. The feature 154 is similar to the feature 124 discussed above with reference to FIG. 48, except that feature 154 comprises an interference region 156 that is a peninsula extending inwardly into a closed end of the feature, rather than outwardly from the closed end of the future. The peninsula of feature 154, like that of feature 124, comprises a wide portion and a narrower portion (labeled as 158 and 160 in FIG. 49), and plurality of stepped terraces (162 and 164) where narrowing occurs in going from the wide portion to the narrow portion.

Although the reticles of FIGS. 48 and 49 are shown having only one feature formed therein, it is to be understood that the reticles would typically be formed to have a plurality of identical features formed therein to simultaneously fabricate a plurality of identical openings within photoresist.

The reticles of FIGS. 48 and 49 have only one interference region. It is to be understood, however, that reticles may be formed to have more than one interference region in order to enhance formation of shallow sidewall regions of photoresist. FIG. 50 shows an exemplary reticle 170 comprising multiple interference regions. Specifically, reticle 170 has a feature 174 patterned in a relatively opaque material 172, with such feature having a pair of interference regions 176 and 178. The interference regions correspond to peninsulas extending outwardly from the main portion of the feature, but it is to be understood that one or both of the peninsulas could also extend inwardly relative to the main feature.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A semiconductor construction, comprising:
a multilayer structure over a semiconductor material;
a first material over the multilayer structure, the first material having an opening extending therethrough, the opening having a less steep sidewall and a pair of steep sidewalls joined together by the less steep sidewall therebetween; and
a second material narrowing the opening and shaped as a pair of lines along and directly against the steep sidewalls, the lines terminating near the less steep sidewall and being spaced from one another by a gap along the less steep sidewall.

2. The construction of claim 1 wherein the semiconductor material comprises monocrystalline silicon.

3. The construction of claim 1 wherein the multilayer structure comprises an electrically conductive material and an electrically insulative capping material over the electrically conductive material.

4. The construction of claim 3 wherein the electrically insulative capping material comprises silicon dioxide, the first material comprises carbon which is directly against the silicon dioxide of the electrically insulative capping material, and the second material comprises silicon nitride.

5. The construction of claim 1 wherein the opening is shaped as a cul-de-sac joined to an alley, and wherein said gap is directly across the cul-de-sac from said alley.

6. The construction of claim 5 wherein the lines are along opposing sides of said alley, and extend more than halfway around said cul-de-sac.

7. A semiconductor construction, comprising:
an electrically conductive material over a monocrystalline silicon-containing substrate;
a first material over the electrically conductive material, the first material having an opening extending therethrough, the opening having a less steep sidewall and a pair of steep sidewalls joined together by the less-steep sidewall therebetween, wherein the first material comprises carbon; and
a second material narrowing the opening and shaped as a pair of lines along and directly against the steep sidewalls, the lines terminating near the less steep sidewall and being spaced from one another by a gap along the less steep sidewall, wherein the second material consists of silicon nitride.

8. The construction of claim 7 wherein the opening is shaped as a cul-de-sac joined to an alley, and wherein said gap is directly across the cul-de-sac from said alley.

9. The construction of claim 8 wherein the lines are along opposing sides of said alley, and extend more than halfway around said cul-de-sac.

* * * * *

UNITED STATES PATENT AND TRADEMARK OFFICE
CERTIFICATE OF CORRECTION

| | | |
|---|---|---|
| PATENT NO. | : 8,217,465 B2 | |
| APPLICATION NO. | : 12/852100 | |
| DATED | : July 10, 2012 | |
| INVENTOR(S) | : Lee DeBruler | |

It is certified that error appears in the above-identified patent and that said Letters Patent is hereby corrected as shown below:

On the Title page, Item (57), under "Abstract", line 3, delete "anistropically" and insert -- anisotropically --, therefor.

Signed and Sealed this
Twenty-eighth Day of August, 2012

David J. Kappos
*Director of the United States Patent and Trademark Office*